(12) United States Patent
Toraichi et al.

(10) Patent No.: US 8,594,343 B2
(45) Date of Patent: Nov. 26, 2013

(54) SOUND PROCESSING APPARATUS AND SOUND PROCESSING METHOD

(75) Inventors: Kazuo Toraichi, Ibaraki (JP); Masakazu Higuchi, Ibaraki (JP); Yasuo Morooka, Ibaraki (JP); Mitsuaki Nakamura, Ibaraki (JP)

(73) Assignee: Japan Science and Technology Agency, Saitama (JP)

( * ) Notice: Subject to any disclaimer, the term of this patent is extended or adjusted under 35 U.S.C. 154(b) by 277 days.

(21) Appl. No.: 12/989,344

(22) PCT Filed: May 1, 2009

(86) PCT No.: PCT/JP2009/058567
§ 371 (c)(1),
(2), (4) Date: Nov. 24, 2010

(87) PCT Pub. No.: WO2009/133948
PCT Pub. Date: Nov. 5, 2009

(65) Prior Publication Data
US 2011/0058686 A1 Mar. 10, 2011
US 2012/0033830 A9 Feb. 9, 2012

(30) Foreign Application Priority Data

May 1, 2008 (JP) ................................. 2008-119923
May 12, 2008 (JP) ................................. 2008-124906
Oct. 6, 2008 (JP) ................................. 2008-259780

(51) Int. Cl.
*H03G 5/00* (2006.01)
(52) U.S. Cl.
USPC ........................................... 381/98; 708/313
(58) Field of Classification Search
USPC ................. 381/98, 100, 101, 102, 104, 94.3; 84/603, 604, 608, 615; 708/313
See application file for complete search history.

(56) References Cited

U.S. PATENT DOCUMENTS 5,283,387 A * 2/1994 Tanaka ........................... 84/608
6,748,409 B1 * 6/2004 Toraichi et al. ............... 708/313

FOREIGN PATENT DOCUMENTS

JP 04-150211 A 5/1992
JP 10-004358 A 1/1998

(Continued)

OTHER PUBLICATIONS

Japanese Office Action dated Jun. 6, 2011 issued in Japanese patent application No. JP2008-1249086.

(Continued)

*Primary Examiner* — Vivian Chin
*Assistant Examiner* — Friedrich W Fahnert
(74) *Attorney, Agent, or Firm* — Fox Rothschild, LLP; Robert J. Sacco

(57) ABSTRACT

There is provided a sound processing apparatus and a sound processing method which are capable of reproducing discrete data with a high-quality sound matching users' preferences. In a sound processing means 2, since an interpolation value reflecting a value of a variable parameter α by which the value of a control sampling function $c_0(t)$ is multiplied can be calculated, an analog signal obtained through the interpolation performed in a sampling function $s_N(t)$ can be regulated in accordance with the variable parameter α by changing the value of the variable parameter α. In this way, by allowing the user to appropriately change the variable parameter α in accordance with various conditions including music reproduction environments, sound sources, musical tones and so on, it becomes possible to reproduce high-quality-sound music in which its frequency characteristics of the analog signal have changed and a high quality desired by the user is obtained.

24 Claims, 17 Drawing Sheets

(56) References Cited

FOREIGN PATENT DOCUMENTS

| | | |
|---|---|---|
| JP | 11-046400 A | 2/1999 |
| JP | 2001-312289 A | 11/2001 |
| JP | 2006-050428 A | 2/2006 |
| JP | 2006-050429 A | 2/2006 |
| WO | WO-9938090 A1 | 7/1999 |

OTHER PUBLICATIONS

International Search Report mailed Aug. 11, 2009, in Application Serial No. PCT/JP2009/058567 filed on May 1, 2009.

Supplementary European Search Report mailed Nov. 12, 2012, Application Serial No. 09738885.4-2225 /02299368 PCT/JP2009058567 in the name of Japan Science and Technology Agency.

Olsson, Mattias et al: "Scaling of multistage interpolators", Proc. XII European Signal Processing Conf., Sep. 1, 2004, XP55042608, Retrieved from the Internet.

Turek, Daniel B., "Design of Efficient Digital Interpolation Filters for Interger Upsampling", Master Thesis, Jun. 1, 2004, pp. 1-44, XP55042816, Retrieved from the Internet: URL:www.rle.mit.edu/dspg/documents/main.pdf [retrieved on Oct. 31, 2012].

* cited by examiner

SOUND PROCESSING APPARATUS AND SOUND PROCESSING METHOD

CROSS REFERENCE TO RELATED APPLICATION

The present application is the 35 U.S.C. §371 National Phase Application of International Application Serial No. PCT/JP2009/058567, filed May 1, 2009, which claims priority under the Paris convention to Japanese Application Serial No. 2008-119923, filed May 1, 2008, Japanese Application Serial No. 2008-124906, filed May 12, 2008, and Japanese Application Serial No. 2008-259780, filed Oct. 6, 2008. The disclosures of each of these applications are incorporated herein by reference in their entirety.

TECHNICAL FIELD

The present invention relates to a sound processing apparatus and a sound processing method, which are suitably applicable, e.g., when intervals among temporally ordered discrete data sampled at a predetermined frequency are interpolated to produce new discrete data by a higher sampling frequency than that of the input original discrete data or produce analogue signals. In addition, in this specification, a process in which signals are produced at high-frequency discrete intervals and a process in which analogue signals are produced are defined as the same processing and are referred to as "the production of analogue signals, thus giving this description. Further, the description, in this specification shall be given with the case where a function value has a finite value other than 0 in a localized region and becomes 0 at a region other than the localized region, referred to as "finite support".

BACKGROUND ART

Heretofore, when analogue data are created from discrete data such as digital data, Shannon's sampling function has been extensively utilized which was derived based on Shannon's sampling theorem. Here, the Shannon's sampling function becomes equals to 1 only at a sample point $t=0$ as shown in FIG. 22 and becomes 0 at all the other sampling points, exhibiting a waveform whose vibration theoretically continues to infinity from $-\infty$ to $+\infty$. Accordingly, when utilizing various processors to actually perform an interpolation process among discrete data using Shannon's sampling function, the interpolation process is forcibly truncated within a finite interval. As a result, there has been the issue that an error was generated due to the truncation.

Further, when utilizing such a Shannon's sampling function, since analogue signals reproduced were subjected to band limitation, when discrete data recorded on. e.g., a CD (Compact Disc) and a DVD (Digital versatile Disc) were converted into analogue signals to be reproduced, high frequencies not less than 22.5 KHz were unable to reproduce, posing the issue that natural sounds containing the sounds with frequencies not less than 22.5 KHz could not be reproduced.

Here, to solve such an issue, the error due to the truncation does not occur and therefore a sampling function has been evolved which is capable of reproducing farther higher frequency range components and converges within a finite range (e.g., see patent document 1). This sampling function converges to 0 at the second sampling positions anteroposterior to the original point and hence signal reproduction can be performed with a small amount of calculations, thus making it possible to ascertain that farther higher-frequency range d is contained.

Reference document 1: International unexamined patent application publication No. 99/38090

DISCLOSURE OF THE INVENTION

Problem to be Solved by the Invention

An audio system using such a sampling function, however, cannot vary high-frequency range components depending on a wide variety of users such as hearing-impaired persons, aged persons and so on and various types of conditions such as music reproduction environments, sound sources, musical tones or the like. Therefore, a frequency characteristic cannot be freely regulated depending on the situations. On the other hand, in recent years, a tailor-made audio system in which users are able to freely regulate by oneself its sound quality including high-frequency range components depending on users' preferences and types of music has been desired to provide.

With the view of the above needs, it is an object of the present invention to provide a sound processing apparatus and a sound processing method which are capable of reproducing discrete data with excellent quality depending on users' preferences.

Means for Solving the Problem

To solve the issue like this, a first aspect of the present invention provides a sound processing apparatus, which is equipped with a function processing means for calculating interpolation values among discrete data, by applying the convolution operation to a plurality of the discrete data temporally-ordered, using a sampling function made up of a liner combination of a fundamental sampling function and a control sampling function which are each expressed by a piecewise polynomial of finite support.

A second aspect of the present invention is a sound processing apparatus in which after applying the convolution operation to each of the discrete data, using the fundamental sampling function and the control sampling function, the function processing means calculates the interpolation values by linearly adding calculated results obtained by the convolution operation using the sampling function.

A third aspect of the present invention is a sound processing apparatus equipped with a band separation means for separating the discrete data into a plurality of frequency bands to produce a plurality of band-by-band signals. Then, the function processing means performs an interpolation process individually for each of the band-by-band signals to produce synthesized signals by synthesizing interpolation processing signals produced for each of the frequency bands, A fourth aspect of the present invention is a sound processing apparatus equipped with a discrete data extraction means for extracting a given number of the discrete data existing in such a manner as to sandwich a marked point where the interpolation values are calculated. Then, the function processing means is equipped with a fundamental term calculation means for calculating a value of the fundamental sampling function, using a distance to the marked point determined for each of the discrete data extracted by the discrete data extraction means, and then calculating a fundamental interpolation value at the marked point, by applying the convolution operation to a value of the fundamental sampling function allowed to correspond to each of the discrete data; a control term calculation means for calculating a value of the control sampling function, using a distance to the marked point determined for each of the discrete data extracted by the discrete data extraction means and then calculating a control interpolation value at the marked point by applying the convolution operation to a value of the control sampling function allowed to correspond to each of the discrete data; and a linear adding means for calculating the interpolation value by linearly adding the fundamental interpolation value calculated by the fundamental term calculation means and the control interpolation value calculated by the control term calculation means.

A fifth aspect of the present invention is a sound processing apparatus in which the function processing means includes a coefficient multiplication means for multiplying the control sampling function by a variable parameter settable as an arbitrary value by a user.

A sixth aspect of the present invention is a sound processing apparatus equipped with a discrete data extraction means for extracting a given number of the discrete data existing in such a manner as to sandwich a marked point where the interpolation values are calculated. Then, the function processing means is equipped with a function calculation means in which the sampling function produced by linearly adding the fundamental sampling function and the control sampling function in advance is stored and which calculates a value of the sampling function, using a distance to the marked point determined for each of the discrete data; and the convolution operation means for calculating an interpolation value at the marked point by applying the convolution operation to a value of the sampling function allowed to correspond to each of the discrete data.

A seventh aspect of the present invention is a sound processing apparatus in which the fundamental sampling function is a function which can be expressed by a piecewise polynomial once differentiable at an interval [−1, 1] of a sampling position of the discrete data and is expressed invariably as 0 at the other intervals. Further, the control sampling function is a function which can be expressed by a piecewise polynomial once differentiable at an interval [−2, 2] of a sampling position of the discrete data and is expresses invariably as 0 at the other intervals.

A eighth aspect of the present invention is a sound processing apparatus in which when a sampling position of the discrete data is defined as t, the fundamental sampling function is defined as f(t) and then the fundamental sampling function is expressed by the following formula 1.

$$f(t) = \begin{cases} 0 & t \in (-\infty, -1) \\ 2(t+1)^2 & t \in \left[-1, -\frac{1}{2}\right) \\ -2t^2+1 & t \in \left[-\frac{1}{2}, \frac{1}{2}\right) \\ 2(-t+1)^2 & t \in \left[\frac{1}{2}, 1\right) \\ 0 & t \in [1, \infty), \end{cases} \quad \text{[Formula 1]}$$

Then, the control sampling function is set as $C_0(t)=C_r(t)+C_r(-t)$ and $C_r(t)$ is expressed by the following formula 2.

$$c_r(t) = \begin{cases} 0 & t \in (-\infty, 0) \\ -t^2 & t \in \left[0, \frac{1}{2}\right) \\ 3(-t+1)^2 - 2(-t+1) & t \in \left[\frac{1}{2}, 1\right) \\ -3(t-1)^2 + 2(t-1) & t \in \left[1, \frac{3}{2}\right) \\ (-t+2)^2 & t \in \left[\frac{3}{2}, 2\right) \\ 0 & t \in [2, \infty) \end{cases} \quad \text{[Formula 2]}$$

A ninth aspect of the present invention is a sound processing apparatus which includes a selector in which a plurality of variable parameters different in the numerical value are stored in advance and any one of the variable parameters to be multiplied by the control sampling function is selected from among a plurality of the variable parameters.

A tenth aspect of the present invention is a sound processing apparatus in which the function processing means is programmed in a programmable signal processing device for forming a calculation configuration with a controlling formation desired by a user, based on program data specified by a user.

An eleventh aspect of the present invention is a sound processing apparatus in which after tabulating values calculated in advance according to a given number of sectioned portions among the discrete data marked, the fundamental sampling function and the control sampling function apply the convolution operation between the tabulated values and the discrete data, multiplication of the variable parameters and said linear adding every time the discrete data are input, thus outputting the interpolation values.

A twelfth aspect of the present invention is a sound processing apparatus in which when the number of the sectioned portions among the discrete data is plural, the tabulated values are calculated in advance using the lowest common multiple in the number of the sectioned portions and thereafter according to the number of the sectioned portions set at the start of inputting the discrete data, the tabulated values are selected to perform convolution operations between said tabulated values and the discrete data.

A thirteenth aspect of the present invention is a sound processing apparatus equipped with a sound pressure regulating means for multiplying any one of the band-by-band signal and the interpolation processing signal by a sound pressure parameter to produce a regulated band-by-band signal whose sound pressure level is regulated for each of the frequency bands. When multiplying the band-by-band signal by the sound pressure parameter, the interpolation processing means performs the interpolation process individually for each of the regulated band-by-band signals.

A fourteenth aspect of the present invention is a sound processing apparatus in which the sound pressure parameter different in each of band-by-band signals is settable.

A fifteenth aspect of the present invention is a sound processing method which includes a function processing step for calculating interpolation values among the discrete data by a function processing means, by applying the convolution operation to a plurality of temporally-ordered discrete data, using the sampling function made up of the linear combination of a fundamental sampling function and a control sampling function which are each expressed by a piecewise polynomial of finite support.

A sixteenth aspect of the present invention is a sound processing method in which the function processing step includes the convolution operation step for applying the convolution operation to each of the discrete data, using the fundamental sampling function and the control sampling function; and a linear adding step for calculating the interpolation values by linearly adding the calculated result obtained by the convolution operation using the sampling function.

A seventeenth aspect of the present invention is a sound processing method which includes a band separating step for separating the discrete data into a plurality of frequency bands to produce a plurality of band-by-band signals. The function processing step includes an interpolation processing step for performing an interpolation process individually for each of the band-by-band signals to produce interpolation signals for each of the frequency bands, and a band synthesizing step for producing synthesized signals by synthesizing a plurality of the interpolation processing signals produced for each of the frequency bands.

A eighteenth aspect of the present invention is a sound processing method which includes a discrete data extraction step for extracting a given number of the discrete data existing in such a manner as to sandwich a marked point where the interpolation values are calculated. Then, the function processing step includes a fundamental term calculation step for calculating a value of the fundamental sampling function, using a distance to the marked point determined for each of the discrete data extracted by the discrete data extraction means and then calculating a value of a fundamental interpolation value at the marked point, by applying the convolution operation to the fundamental sampling function allowed to correspond to each of the discrete data; a control term calculating step for calculating a value of the control sampling function, using a distance to the marked point determined for each of the discrete data extracted by the discrete data extraction means, by applying the convolution operation to a value of the control sampling function allowed to correspond to each of the discrete data; and a linearly adding step for calculating the interpolation value by linearly adding the fundamental interpolation value calculated by the fundamental term calculation means and the control interpolation value calculated by the control term calculation means.

A nineteenth aspect of the present invention is a sound processing method in which the function processing step includes a coefficient multiplication step for multiplying the control sampling function by a variable parameter settable as an arbitrary numerical value by a user.

A twentieth aspect of the present invention is a sound processing method which includes a discrete data extraction step for extracting a given number of the discrete data existing in such a manner as to sandwich a marked point where the interpolation values are calculated. Then, the function processing step includes a function calculation step for storing in advance the sampling function produced by linearly adding the fundamental sampling function and the control sampling function and thereafter calculating a value of the sampling function, using a distance to the marked point determined for each of the discrete data; and the convolution operation step for calculating an interpolation value at the marked point by applying the convolution operation to a value of the sampling function allowed to correspond to each of the discrete data.

A twenty-first aspect of the present invention is a sound processing method in which the fundamental sampling function is a function which is expressed by a piecewise polynomial once differentiable at an interval [−1, 1] of a sampling position of the discrete data and is expressed invariably as 0 in the other intervals. Further, the control sampling function is a function which is expressed by a piecewise polynomial once differentiable at an interval [−2, 2] of a sampling position of the discrete data and is expressed invariably as 0 at the other interval.

A twenty-second aspect of the present invention is a sound processing method in which when the sampling position of the discrete data is defined as t, the fundamental sampling function is defined as f(t) and then the fundamental sampling function is expressed by the following formula 3.

$$f(t) = \begin{cases} 0 & t \in (-\infty, -1) \\ 2(t+1)^2 & t \in \left[-1, -\frac{1}{2}\right) \\ -2t^2 + 1 & t \in \left[-\frac{1}{2}, \frac{1}{2}\right) \\ 2(-t+1)^2 & t \in \left[\frac{1}{2}, 1\right) \\ 0 & t \in [1, \infty), \end{cases} \quad \text{[Formula 3]}$$

The control sampling function, $C_0(t) = C_r(t) + C_r(-t)$ are set and then $C_r(t)$ is expressed by the following formula 4.

$$c_r(t) = \begin{cases} 0 & t \in (-\infty, 0) \\ -t^2 & t \in \left[0, \frac{1}{2}\right) \\ 3(-t+1)^2 - 2(-t+1) & t \in \left[\frac{1}{2}, 1\right) \\ -3(t-1)^2 + 2(t-1) & t \in \left[1, \frac{3}{2}\right) \\ (-t+2)^2 & t \in \left[\frac{3}{2}, 2\right) \\ 0 & t \in [2, \infty) \end{cases} \quad \text{[Formula 4]}$$

A twenty-third aspect of the present invention is a sound processing method in which in the parameter setting step, any one of variable parameters to be multiplied by the control sampling function is selected from among a plurality of variable parameters which are stored in advance and are different in the numerical value.

A twenty-fourth aspect of the present invention is a sound processing method in which the function processing step is performed by a calculation circuit configuration with a controlling formation, desired by a user, which is programmed in a programmable signal processing device based on program data specified by a user.

A twenty-fifth aspect of the present invention is a sound processing method in which in the function processing step, after tabulating calculated values of said fundamental sampling function and said control sampling function in advance according to a given number of sectioned portions among said discrete data marked, the convolution operation between said tabulated values and said discrete data, multiplications of said variable parameters and said linear adding are performed every time said discrete data are input, thus outputting the interpolation values.

A twenty-sixth aspect of the present invention is a sound processing method in which in the function processing step, when the number of sectioned portions among the discrete data is plural, the tabulated values are calculated in advance using the lowest common multiple in the number of sectioned portions and thereafter according to the number of the sectioned portions set at the start of inputting the discrete data, the tabulated values are selected to apply the convolution operation between the tabulted values and the discrete data.

A twenty-seventh aspect of the present invention is a sound processing method including a sound pressure regulating step behind any one of the band separation step and the interpolation processing step. The sound pressure regulating step multiplies the band-by-band signal by a sound pressure parameter behind the band separation step and further multiplies the interpolation processing signal by a sound pressure parameter to produce the regulated band-by-band signal whose sound pressure level is regulated for each of the frequency bands by the sound pressure parameter. When multiplying the band-by-band signal by a sound pressure parameter, the interpolation processing means performs the interpolation process individually for each of the regulated band-by-band signals.

A twenty-eighth aspect of the present invention is a sound processing method which includes a sound pressure parameter setting process in which the sound pressure parameter different in each of the band-by-band signals is settable by a setting unit.

Effects of the Invention

According to the sound processing apparatus of the first aspect of the present invention and according to the sound processing method of the fifteenth aspect of the present invention, the interpolation value reflected by the numerical value of the variable parameter by which the control sampling function is multiplied is allowed to be calculated and thereby the numerical value of the variable parameter is varied. Therefore, the interpolated value obtained by performing the interpolation process by means of the sampling function can be regulated depending on the variable parameter. Thus, a user varies appropriately the variable parameter depending on various types of conditions such as music reproduction environments, sound sources, musical tones or the like and as a consequence, the frequency characteristics of the signals produced based on the interpolated values varies. Hence, a high-quality-sound music with a sound quality desired by a user can be reproduced.

BEST MODE FOR CARRYING OUT THE INVENTION

Hereunder is a detailed description of embodiments based on the accompanying drawings.

First Embodiment

(1) The Fundamental Concept of the Present Invention

Figure 1:
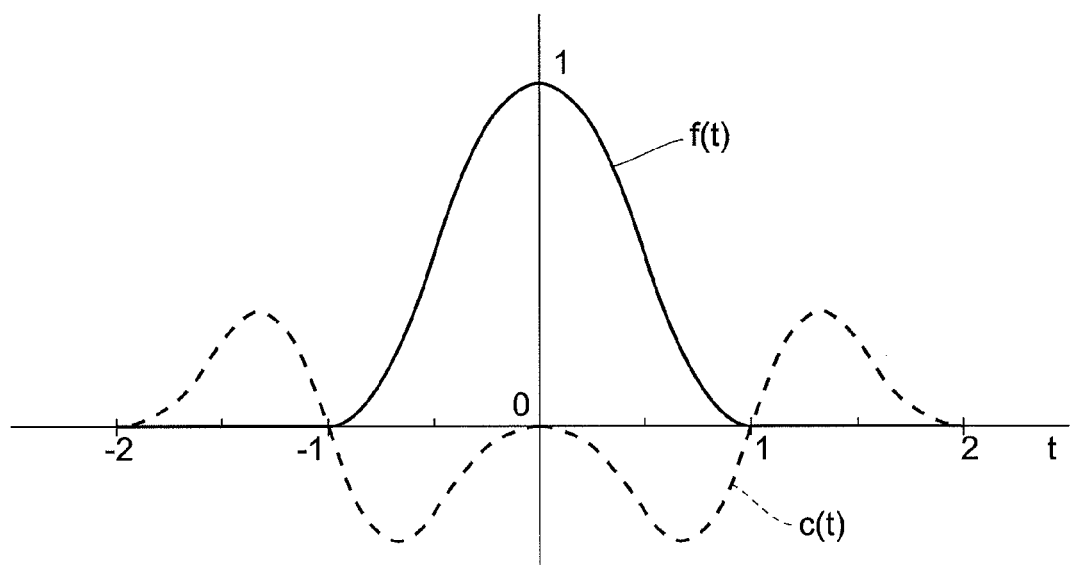
FIG. 1 is a schematic view illustrating a relationship between a waveform of a fundamental sampling function and a waveform of a control sampling function, according to the present invention.

FIG. 1 shows each of waveforms exhibited by a fundamental sampling function f(t) and a control sampling function $c_0(t)$ which make up a sampling function used for an interpolation process according to the present invention. In addition, in FIG. 1, the abscissa axis denotes a sampling position t of discrete data and the ordinate axis denotes each of values of the sampling function. Here, the sampling position of discrete data is defined as t. A sampling function $s_2(t)$ made up of the fundamental sampling function f(t) and the control sampling function $c_0(t)$ which exist among sampling positions [−2, 2] of the discrete data is expressed by the following formula 5.

$$s_2(t) = f(t) + \alpha \cdot c_0(t) \quad \text{[Formula 5]}$$

where $c_0(t) = c_r(t) + c_r(-t)$ and when a general control sampling function is defined as $c_k(t)$ and $c_k(t) = c_r(t-k) + c_r(-t-k)$ are set, among the sampling positions [−N, N] of the discrete data, a sampling function $s_N(t)$ is expressed by the following formula 6.

$$S_N(t) = f(t) + \sum_{k=0}^{N-2} \alpha_k \cdot c_k(t) \quad \text{[Formula 6]}$$

In addition, $\alpha_k$ denotes a variable parameter described below and an arbitrary numerical value settable by a user and $\alpha_k$ may be invariable by k as a result of setting $\alpha_1 = \alpha_2 = \alpha_3$.

Here, the fundamental sampling function f(t) is a function expressed by a piecewise polynomial of finite support focused on differentiability. This function, e.g., is only once differentiable over its whole range and has a finite value other than 0 when a sampling position t along the abscissa axis exists in the range of −1 to 1 (that is, an interval [−1, 1]) and in the other regions, is expressed invariably as 0. Specifically, the fundamental sampling function f(t) is in the form of an n-order polynomial function in each short section produced by sectioning the interval [−1, 1] into two or more sections and at the boundaries among the short sections, the fundamental sampling function f(t) is continuous (a value and slope of the function are each continuous). This fundamental sampling function f(t) exhibits a concave and undulate waveform differentiable n−1 (n is an integer not less than 2) times over its whole range. Further, this fundamental sampling function f(t) becomes 1 only at the sampling position and converges to 0 toward t=±1 and keeps 0 further toward t=±2.

Further, this fundamental sampling function f(t) may be a function of an impulse response waveform of finite support and further may be a continuous n-order piecewise polynomial function which is at least once differentiable at an arbitrary position within a sampling position interval.

Specifically, the fundamental sampling function f(t) like this is expressed as the following formula 7.

$$f(t) = \begin{cases} 0 & t \in (-\infty, -1) \\ 2(t+1)^2 & t \in \left[-1, -\frac{1}{2}\right) \\ -2t^2 + 1 & t \in \left[-\frac{1}{2}, \frac{1}{2}\right) \\ 2(-t+1)^2 & t \in \left[\frac{1}{2}, 1\right) \\ 0 & t \in [1, \infty), \end{cases}$$ [Formula 7]

Then, by performing overlapping operations, using this fundamental sampling function f(t), based on each discrete data, the temporary interpolation is possible using a function in which values among discrete data can be only once differentiated.

At the same time, the control sampling function $c_0(t)$ is a function expressed by a piecewise polynomial of finite support focused on differentiability and is expressed by an n-order polynomial function like the fundamental sampling function. The control sampling function $c_0(t)$ is, e.g., only once differentiable over its whole range and has a finite value other than 0 when a sampling position t along the abscissa axis exists in the range of −2 to 2 (that is, an interval [−2, 2]) and in the other ranges, is expressed invariably as 0. Further, the control sampling function $c_0(t)$ exhibits an undulate form only once differentiable over its whole range and becomes 0 at each of the sampling positions t=0, ±1, ±2. Furthermore, this control sampling function $c_0(t)$ may be a function of an impulse response waveform of finite support and further may be an n-order continuous piecewise polynomial function at least once differentiable at an arbitrary position within the sampling position interval.

Here, the control sampling function $c_0(t)$ is expressed as the control sampling function $c_0(t)=c_r(t)+c_r(-t)$ and this $c_r(t)$ is expressed by the following formula 8.

$$c_r(t) = \begin{cases} 0 & t \in (-\infty, 0) \\ -t^2 & t \in \left[0, \frac{1}{2}\right) \\ 3(-t+1)^2 - 2(-t+1) & t \in \left[\frac{1}{2}, 1\right) \\ -3(t-1)^2 + 2(t-1) & t \in \left[1, \frac{3}{2}\right) \\ (-t+2)^2 & t \in \left[\frac{3}{2}, 2\right) \\ 0 & t \in [2, \infty) \end{cases}$$ [Formula 8]

Then, by performing overlapping operations using this control sampling function $c_0(t)$ based on each discrete data, the temporary interpolation is possible using a function in which values among discrete data can be only once differentiated.

By linearly adding the temporary interpolation value (hereunder, referred to as a fundamental interpolation value) calculated in this manner based on the fundamental sampling function f(t) and the temporary interpolation value (hereunder, referred to as a control interpolation value) calculated in this manner based on the control sampling function $c_0(t)$, the interpolation of the value at an arbitrary position among discrete data is possible using the function only once differentiable.

Incidentally, in the linear combination of the fundamental sampling function f(t) and the control sampling function $c_0(t)$, these functions must be satisfied by the following six conditions. First, $S_2(0)=1$, $S_2(\pm 1)=S_2(\pm 2)=0$ are satisfied; second, these functions are each an even function (that is, the function symmetric about the y axis); third, within the sampling position intervals [−∞, −2], [2, ∞], these functions are invariably 0; fourth, in each of the intervals [n/2, (n+1)/2] (−4≤n≤3), these functions are at most quadratic polynomial; fifth, over the whole range, C1 class is satisfied for these functions, that is, only once differentiable, and sixth, within the sampling position interval [−½, −2], the following formula 9 is satisfied.

$$\sum_{k=-2}^{2} s_2(t-k) \equiv 1$$ [Formula 9]

In addition, the sampling function $s_2(t)$ when N=2 is hereunder described simply as a sampling function $s_N(t)$ for convenience sake.

Further, in addition to this, at this time, the control sampling function $c_0(t)$ can be multiplied by a variable parameter α set as an arbitrary value by a user. Accordingly, the control sampling function $c_0(t)$ can be varied in amplitude of its waveform according to a numerical value of the variable parameter α between sampling positions from −2 to +2 with the control sampling function $c_0(t)$ kept 0 at the sampling positions t=0, ±1, ±2. As a result, the control sampling function $c_0(t)$ is able to vary the result calculated by the convolution operation between itself and the fundamental sampling function f(t). Thus, the variable parameter α is varied in numerical value and thereby varies the frequency characteristic of analogue signals obtained by the calculation performed by the sampling function $s_N(t)$, thus permitting the signal levels of high-frequency components to be regulated.

N Consequently, in the present invention, when the convolution operation is applied to the results calculated by the fundamental sampling function f(t) and the control sampling function $c_0(t)$ to determine interpolation values, the interpolation values can be regulated by the variable parameter α which is multiplied by the control sampling function $c_0(t)$. Therefore, in the present invention, the frequency characteristic of the analogue signals produced by interpolating positions among discrete data by the interpolation values can be freely regulated by the variable parameter α.

(2) Overall Architecture of an Audio Apparatus

Figure 2:
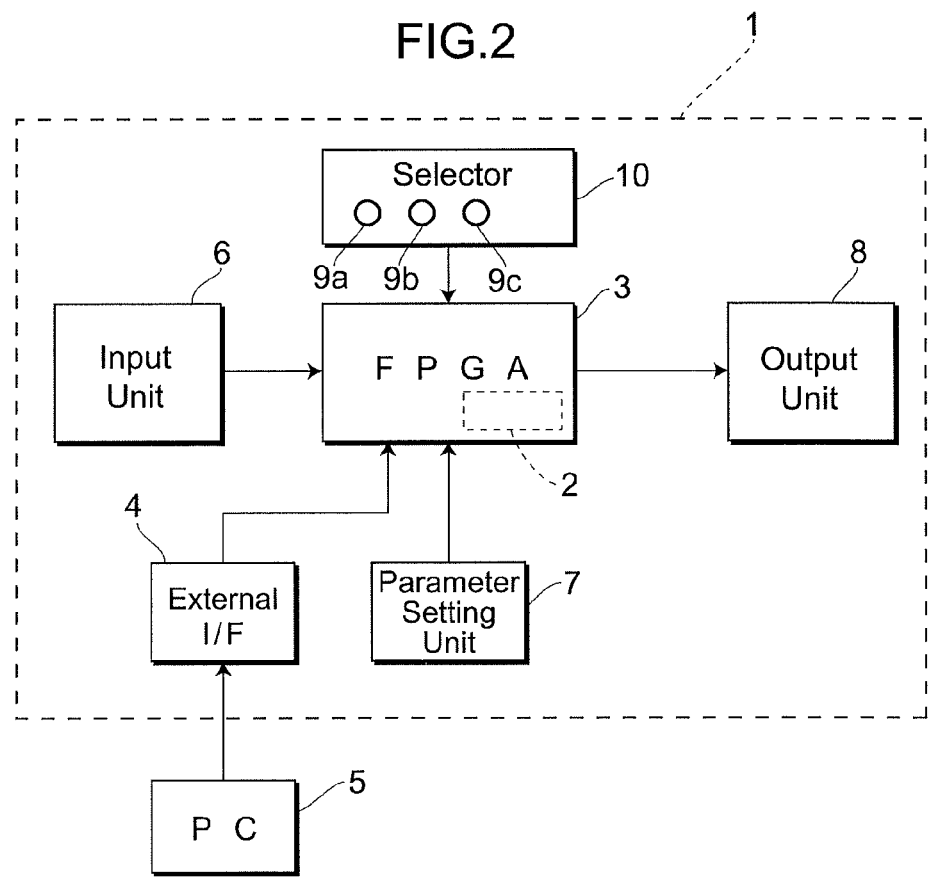
FIG. 2 is a block diagram illustrating a circuit configuration of an audio apparatus according to a first embodiment.

Next, a description is hereunder given about an audio apparatus in which an interpolation process is performed using the sampling function $s_N(t)$ described above. In FIG. 2, numeral symbol 1 denotes the audio apparatus and its sound processing means 2 is programmed in a field programmable gate array (hereunder, referred to as FPGA) 3. Incidentally, in the FPGA 3 acting as a programmable signal processing device, a plurality of circuit blocks and interconnection blocks is regularly arranged on a chip. A plurality of devices in which an electrical connection or electrical nonconnection of a circuit is programmable is arranged inside the circuit block and the interconnection block. A user programs (defines) these devices and thereby insides of the blocks and interconnections between the blocks are able to be designed in the field (a utilization site).

For reference's sake, in this audio apparatus 1, various types of other sampling functions such as Shannon's sampling function, the sampling function described above in the formula 9 according to the present invention, sampling functions different entirely from these sampling functions or the like are programmed in the FPGA 3 from a personal computer 5 via an external interface 4. Therefore, by altering the connections between the circuit blocks and the interconnection blocks in the FPGA 3, the circuit configuration of the audio apparatus 1 can be varied into the hardware capable of performing an interpolation process using various types of sampling functions. Thus, in the audio apparatus 1, the circuit configuration in the FPGA 3 can be changed into one desired by a user only by simply programming the FPGA 3. Hence, when searching an optimal sampling function, a circuit board need not be actually fabricated in each case according to various types of sampling functions, thus attaining a reduction in cost just as much.

In addition, in the embodiment described above, the FPGA 3 is applied in FIG. 2 to suggest an implementation method using the FPGA 3. The present invention is, however, not limited to this method and can be realized by a programmable signal processing device such as a DSP (Digital Signal Processor). For example, some controller made up of a CPU (Central Processing Unit), memories or the like may be applicable.

Here, in the audio apparatus 1 according to the present invention, the sampling function f(t) expressed by the formula 7 and the control sampling function $c_0(t)$, in which $c_r(t)$ is expressed by the formula 8, which satisfy the condition of the sampling function $s_N(t)$ in the formula 9 described above can be programmed in the FPGA 3 from the personal computer 5 via the external interface 4.

Consequently, the FPGA 3 integrally controls the whole of the audio apparatus 1 according to a given program, and thereby the audio apparatus 1 reproduces, e.g., various recording media such as CDs, DVDs or the like by an input unit 6 to sequentially output a plurality of temporally-ordered discrete data obtained by the reproduction to the sound processing means 2. For reference's sake, discrete data mean data obtained by smoothly sampling varying continuous signals at a certain time intervals and then quantizing the sampled data obtained by that sampling.

Now, a parameter setting unit 7 by which a user can freely set a numerical value of the variable parameter α is connected with the FPGA 3. When a user sets the variable parameter α as an arbitrary value by the parameter setting unit 7, information indicating the numerical value that has been set can be output from the parameter setting unit 7 to the sound processing means 2. When interpolating positions among discrete data using the sampling function $s_N(t)$ to increase the sampling frequency in a pseudo manner, that is, performing a so-called oversampling process, the sound processing means 2 acting as a sound processing apparatus calculates interpolation values reflected by the numerical value of the variable parameter α to output the interpolation values to an output unit 8.

When the interpolation values have been input at given intervals from the sound processing means 2, the output unit 8 converts the interpolated signals into analogue signals corresponding to the interpolation values, thereby permitting the signals to be output as music sounds based on the analogue signals. In this manner, by varying the numerical value of the variable parameter α, the sound apparatus 1 can produce analogue signals with high-quality sounds which have been reflected by the numerical value of the variable parameter α and are desired by users.

Further, a selector 10 equipped with a plurality of buttons 9a, 9b, 9c is connected with the FPGA 3. The selector 10 is incorporated with variable parameters which are different in numerical value and are preliminarily associated with each of the selector buttons 9a, 9b, 9c. Then, by selecting any one of the buttons 9a, 9b, 9c, a numerical value of the corresponding variable parameter α is multiplied by the control sampling function $c_0(t)$, allowing the interpolation process to be performed by the sampling function $s_N(t)$.

Specifically, in this embodiment, when the selector button 9a, e.g., is selected, the interpolation process is performed by the sampling function $s_N(t)$ whose variable parameter α is set as −1.5, while when another selector button 9b is selected, the interpolation process is performed by the sampling function $s_N(t)$ whose variable parameter α is set as −2.5 and when yet another button 9c is selected, the interpolation process is performed by the sampling function $s_N(t)$ whose variable parameter α is set as 1.5.

Consequently, in the audio apparatus 1, users can set a numerical value of the variable parameter α as an arbitrary value by the parameter setting unit 7. At the same time, any one of the buttons 9a, 9b, 9c is only selected and thereby without finely setting the variable parameter by the parameter setting unit 7 in each case, the interpolation process using a desired variable parameter α can be easily performed.

Figure 3:
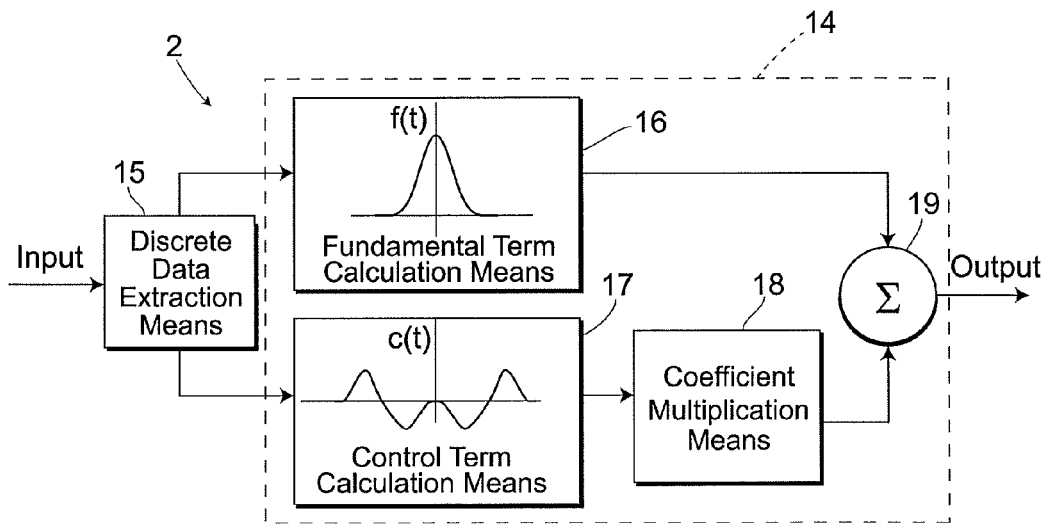
FIG. 3 is a block diagram illustrating a circuit configuration of a sound processing means according to the first embodiment.

(3) Circuit Configuration of the Sound Processing Means (3-1) General Description of the Interpolation Process in the Sound Processing Means Practically, the sound processing means 2 with a circuit configuration as shown in FIG. 3 can be programmed in the FPGA 3. The sound processing means 2 comprises a discrete data extraction means 15 for extracting a given number (here, four) of discrete data in series to hold the discrete data and a function processing means 14 for receiving at a time a given number of discrete data which has been extracted to be held by the discrete data extraction means 15 to perform an interpolation process using these discrete data received. Thus, positions among discrete data input in series from the input unit 6 can be interpolated at given time intervals.

The function processing means 14 comprises a fundamental term calculation means 16 for calculating terms of the fundamental sampling function f(t) among the sampling function $s_N(t)$ based on discrete data, a control term calculation means 17 for calculating terms of the control sampling function $c_0(t)$ among the sampling function $s_N(t)$ based on the discrete data, a coefficient multiplication means 18 for multiplying the calculated results of the control term calculation means 17 by a variable parameter α, and a linear adding means 19 for linearly adding the calculated results of the fundamental term calculation means 16 and the calculated results of the coefficient multiplication means 18.

In this embodiment, the discrete data extraction means 15 extracts the last four discrete data from among the discrete data input in series to hold the four discrete data until new discrete data are next input and then delivers these four discrete data to each of the fundamental term calculation means 16 and the control term calculation means 17.

The fundamental term calculation means 16 has stored the fundamental sampling function f(t) in a given storage means (not shown) and when an interpolation position is specified among the discrete data, calculates a value of the fundamental sampling function f(t) based on a distance between this interpolation position and the discrete data. This fundamental term calculation means 16 can calculate a value of the fundamental sampling function f(t) for each of the four discrete data delivered from the discrete data extraction means 15. Further, the fundamental term calculation means 16 multiples each of the four values, obtained for each of the discrete data, of the fundamental sampling function f(t) by a value of the discrete data corresponding to each of the four values of the discrete data and thereafter applies convolution operations to these four discrete data to deliver the calculated results of the convolution operations to the linear adding means 19.

At the same time, the control term calculation means 17 has stored the control sampling function $c_0(t)$ in a given storage means (not shown) and when an interpolation position is specified, calculates a value of the control sampling function $c_0(t)$ based on the distance between this interpolation position and the discrete data. This control term calculation means 17 can calculate a value of the control sampling function $c_0(t)$ for each of the four discrete data delivered from the discrete data extraction means 15. Further, the control term calculation means 17 multiples each of the four values, obtained for each of the discrete data, of the control sampling function $c_0(t)$ by a value of the discrete data corresponding to each of the discrete data and thereafter applies convolution operations to the four discrete data by adding the multiplied values to deliver the results of the convolution operations to the coefficient multiplication means 18.

The coefficient multiplication means 18 receives, from the control term calculation means 17, the calculated results of the convolution operations applied to the control sampling function $c_0(t)$ and then multiplies the calculated results by a variable parameter α to deliver the obtained multiplied results by the variable parameter to the linear adding means 19. The linear adding means 19 receives the multiplied results of the convolution operations applied to the fundamental sampling function f(t) from the fundamental term calculation means 16 and the multiplied results by the variable parameter α from the coefficient multiplication means 18 and then adds linearly the calculated results and the multiplied results to thereby obtain the linearly added results corresponding to the four discrete data. The value thus obtained by the linearly adding acts as an interpolation value at the interpolation positions between given two discrete data. For reference's sake, this interpolation position is updated at preset intervals, specifically every period of T/N, produced by multiplying a period T, corresponding to the input interval of discrete data, by 1/N, corresponding to each input interval of the discrete data.

Figure 4:
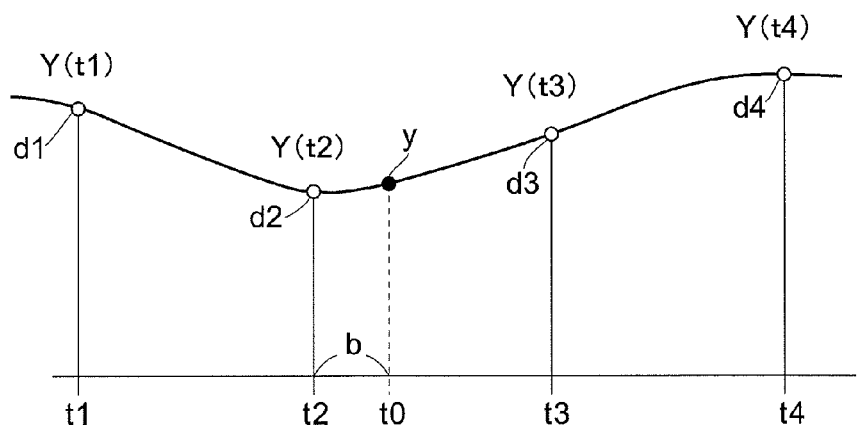
FIG. 4 is a schematic view illustrating a positional relationship between four discrete data and a marked point.

(3-2) Specific Example for Determining an Interpolation Value Based on the Four Discrete Data Next, using FIG. 4 showing a positional relationship between the four continuous discrete data and a marked point acting as an interpolation position, a description is hereunder given about an interpolation process for calculating an interpolation value between given two discrete data based on the temporally-ordered four discrete data. In FIG. 4, each of discrete data d1, d2, d3, d4 which are input in series corresponding to sampled positions t1, t2, t3, t4 are defined as Y(t1), Y(t2), Y(t3), Y(t4). A given position t0 (a distance from t2 is b) between sampling positions t2 and t3 is defined as an interpolation position and a case of determining a interpolation value y corresponding to this interpolation position is looked at.

The sampling function $s_N(t)$ used in the present embodiment converges to 0 at the sampling positions t=±2 and hence the discrete data d1, d2, d3, d4 between t=±2 may be taken into account. Accordingly, when the interpolation value y shown in FIG. 4 is determined, only four discrete data d1, d2, d3, d4 corresponding to t1, t2, t3, t4 may be eventually taken into account, thus allowing the calculation amount to be substantially reduced. Additionally, as for the discrete data equal to or out of t=±3 (not shown), the discrete data are essentially considerable, but these discrete data are not ignored in consideration of a calculation amount, a calculation accuracy or the like and in fact, no truncation error occurs due to no need for theoretically taking into account the discrete data.

Figure 5:
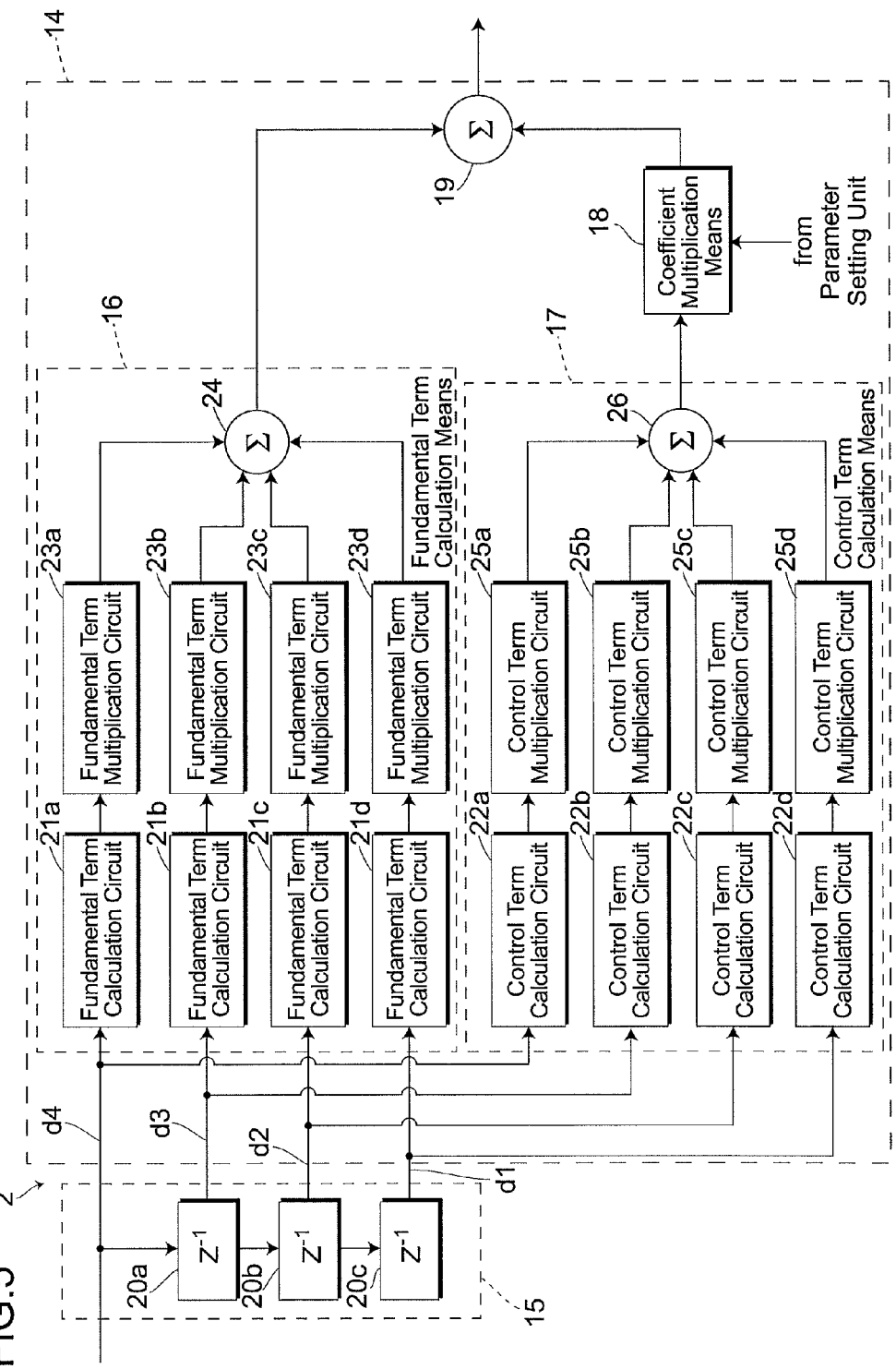
FIG. 5 is a block diagram illustrating a detailed configuration of the sound processing means.

As shown in FIG. 5, the discrete data extraction means 15 is equipped with three shift circuits 20a, 20b, 20c and when continuous discrete data are input, the discrete data are shifted in each of the shift circuits 20a, 20b, 20c, e.g., at the sampling period (44.1 kHz) used for CDs, the discrete data extraction means 15 can extract and retain each one of the last discrete data d1, d2, d3, d4 in each of the shift circuits 20a, 20b, 20c. That is, when the continuous four discrete data d1, d2, d3, d4 are input, the discrete data extraction means 15 delivers the last discrete data d4 directly to a fundamental term calculation circuit 21a of the fundamental term calculation means 16 and a control term calculation circuit 22a of the control term calculation means 17.

Further, the discrete data extraction means 15 delivers a discrete data sequence comprising the continuous four discrete data d1, d2, d3, d4 to the shift circuit 20a to shift the discrete data sequence by the shift circuit 2b and thereby extract the second last discrete data d3 in relation to the last discrete data d4 to deliver the discrete data d3 to both the fundamental term calculation circuit 21b of the fundamental term calculation means 16 and a control term calculation circuit 22b of the control term calculation means 17.

Furthermore, the discrete data extraction means 15 continues to deliver the discrete data sequence in series also to the remaining shift circuits 20b, 20c to further shift the discrete data sequence by the shift circuit 20b to deliver the third last discrete data d2 in relation to the last discrete data d4 to both the fundamental term calculation circuit 21c and the control term calculation circuit 22c and furthermore shift the discrete data sequence by the shift circuit 20c to deliver the fourth last discrete data d1 in relation to the last discrete data d4 to both the fundamental term calculation circuit 21d and the control term calculation circuit 22d.

Here, FIG. 6 and FIG. 7 are schematic views illustrating the interpolation process for a given position t0 in the fundamental term calculation means 16 and the control term calculation means 17. With regard to the content of the interpolation process, first, as described above, performed are a calculation process for calculating a fundamental interpolation value in the fundamental term calculation means 16 (hereunder, referred to as simply a fundamental interpolation value calculation process) and a calculation process for calculating a control interpolation value in the control term calculation means 17 and the coefficient multiplication means 18 (hereunder, referred to as simply a control interpolation value calculation process). Hereunder, using FIG. 6 and FIG. 7, the fundamental interpolation value calculation process and the control interpolation value calculation process are described.

(3-2-1) Fundamental Interpolation Value Calculation Process

With regard to the content of the fundamental interpolation value calculation process, as shown in FIGS. 6(A) to 6(D), a peak height at t=0 (a central position) in the fundamental sampling function f(t) is allowed to coincide with each of the sampling positions t1, t2, t3, t4 and then each value of the fundamental sampling function f(t) is determined at the interpolation position t0 at that time.

Figure 6A:
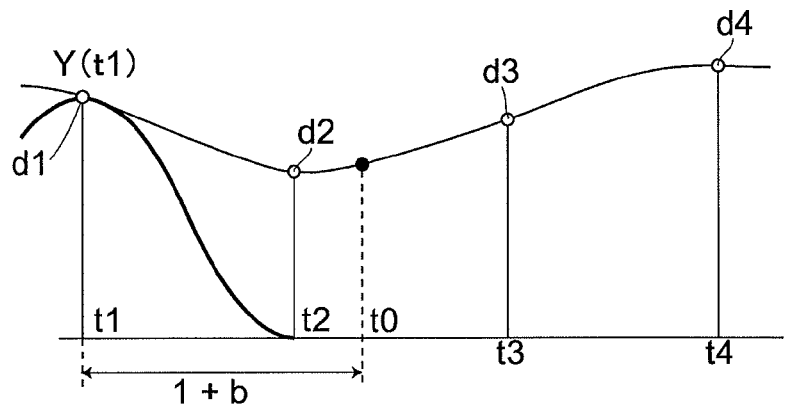
FIG. 6 is a schematic view illustrating an interpolation process using the fundamental sampling function, which is performed by a sound processing means 2, according to the present invention.

Focusing on the discrete data d1 at the sampling position t1 shown in FIG. 6(A), a distance between the interpolation position t0 and the sampling position t1 becomes 1+b. Accordingly, a value of the fundamental sampling function f(t) at the interpolation position t0 when allowing the central position of the fundamental sampling function f(t) to coincide with the sampling position t1 becomes f(1+b). Practically, the peak height at the central position of the fundamental sampling function f(t) is adjusted so as to coincide with the value Y(t1) of the discrete data d1 and hence a value of (1+b)·Y(t1), produced by multiplying f(1+b) described above by Y(t1), becomes a desired value. The calculation of f(1+b) is performed in the fundamental term calculation circuit 21$a$ of the fundamental term calculation means 16, while the calculation of multiplying f(1+b) by Y(t1) is performed in a fundamental term multiplying circuit 23$a$ of the fundamental term calculation means 16 (see FIG. 5).

Figure 6B:
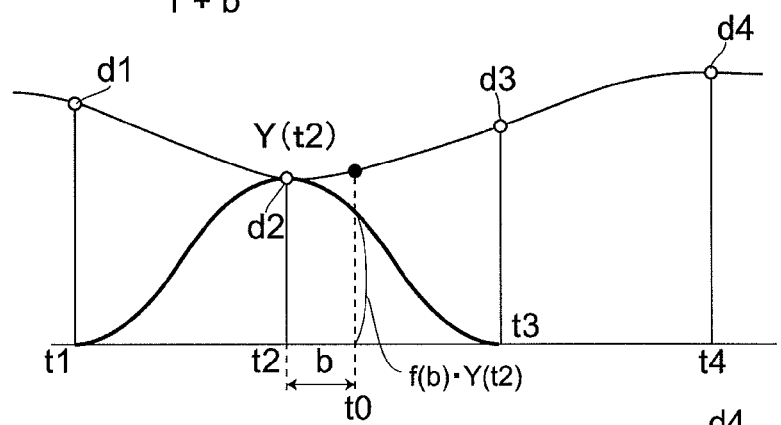

Similarly, focusing on a value Y(t2) of the discrete data d2 at the sampling position t2 shown in FIG. 6(B), a distance between the interpolation position t0 and the sampling position t2 becomes b. Accordingly, a value of the fundamental sampling function f(t) at the interpolation position t0 when allowing the central position of the fundamental sampling function f(t) to coincide with the sampling position t2 becomes f(b). Practically, the peak height at the central position of the fundamental sampling function f(t) is adjusted so as to coincide with the value Y(t2) of the discrete data d2 and hence a value of f(b)·Y(t2), produced by multiplying f(b) described above by Y(t2), becomes a desired value. The calculation of f(b) is performed in the fundamental term calculation circuit 21$b$ of the fundamental term calculation means 16, while the calculation of multiplying f(b) by Y(t2) is performed in a fundamental term circuit multiplying circuit 23$b$ of the fundamental term calculation means 16 (see FIG. 5).

Figure 6C:
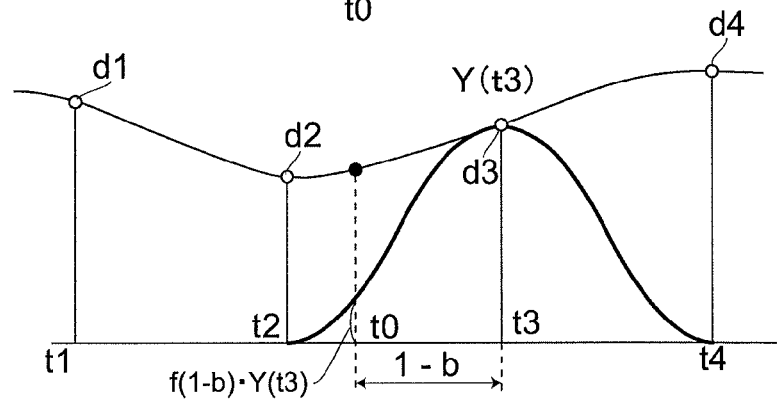

Focusing on a value Y(t3) of the discrete data d3 at the sampling position t3 shown in FIG. 6(C), a distance between the interpolation position t0 and the sampling position t3 becomes 1−b. Accordingly, a value of the fundamental sampling function f(t) at the interpolation position t0 when allowing the central position of the fundamental sampling function f(t) to coincide with the sampling position t3 becomes f(1−b). Practically, the peak height at the central position of the fundamental sampling function f(t) is adjusted so as to coincide with the value Y(t3) of the discrete data d3 and hence a value of f(1−b)·Y(t3), produced by multiplying f(1−b) described above by Y(t3), becomes a desired value. The calculation of f(1−b) is performed in the fundamental term calculation circuit 21$c$ of the fundamental term calculation means 16, while the calculation of multiplying f(1−b) by Y(t3) is performed in a fundamental term multiplying circuit 23$c$ of the fundamental term calculation means 16 (see FIG. 5).

Figure 6D:
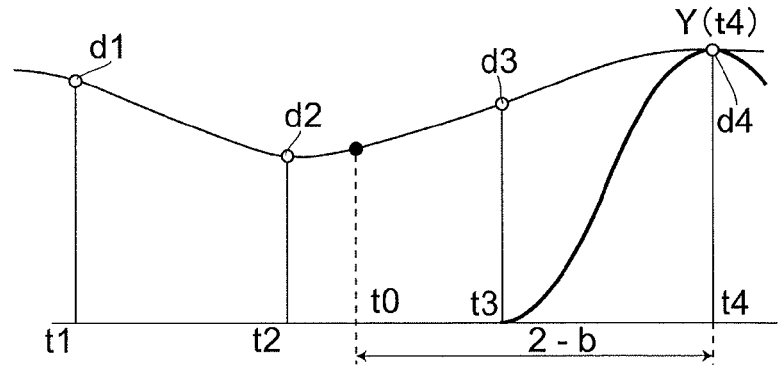

Focusing on a value Y(t4) of the discrete data d4 at the sampling position t4 shown in FIG. 6(D), a distance between the interpolation position t0 and the sampling position t4 becomes 2−b. Accordingly, a value of the fundamental sampling function f(t) at the interpolation position t0 when allowing the central position of the fundamental sampling function f(t) to coincide with the sampling position t4 becomes f(2−b). Practically, the peak height at the central position of the fundamental sampling function f(t) is adjusted so as to coincide with the value Y(t4) of the discrete data d4 and hence a value of f(2−b)·Y(t4), produced by multiplying f(2−b) described above by Y(t4), becomes a desired value. The calculation of f(2−b) is performed in the fundamental term calculation circuit 21$d$ of the fundamental term calculation means 16, while the calculation of multiplying f(2−b) by Y(t4) is performed in a fundamental term multiplying circuit 23$d$ of the fundamental term calculation means 16 (see FIG. 5).

Then, in a fundamental term convolution operation circuit 24, the fundamental term calculation means 16 applies the convolution operation to the four values f(1+b)·Y(t1), f(b)·Y(t2), f(1−b)·Y(t3), f(2−b)·Y(t4) which are obtained corresponding to the marked point of the interpolation position t0 and as a result, a fundamental interpolation value ya corresponding to the marked point is calculated. In addition, a calculation performed by the whole of the fundamental term calculation means 16 is the convolution operation, whereas the fundamental term convolution operation circuit 24 simply adds the multiplied results in each of the fundamental term multiplying circuits 23$a$ to 23$d$. For reference's sake, in the present embodiment, the values of f(1+b)·Y(t1) and f(2−b)·Y(t4) become 0 as shown in FIGS. 6(A), 6(D) and therefore {f(b)·Y(t2)}+{f(1−)·Y(t3)} becomes effective as the fundamental interpolation value ya.

(3-2-2) Control Interpolation Value Calculation Process

With regard to the content of the control interpolation value calculation process, as shown in FIGS. 7(A) to 7(D), t=0 (a central position) of the control sampling function $c_0$(t) is allowed to coincide with each of the sampling positions t1, t2, t3, t4 to apply multiplication to values Y(t1), Y(t2), Y(t3), Y(t4) of the discrete data d1, d2, d3, d4 corresponding to the control sampling function $c_0$(t) and thereby determine each value of the control sampling function $c_0$(t) at the interpolation position t0 at that time.

Figure 7A:
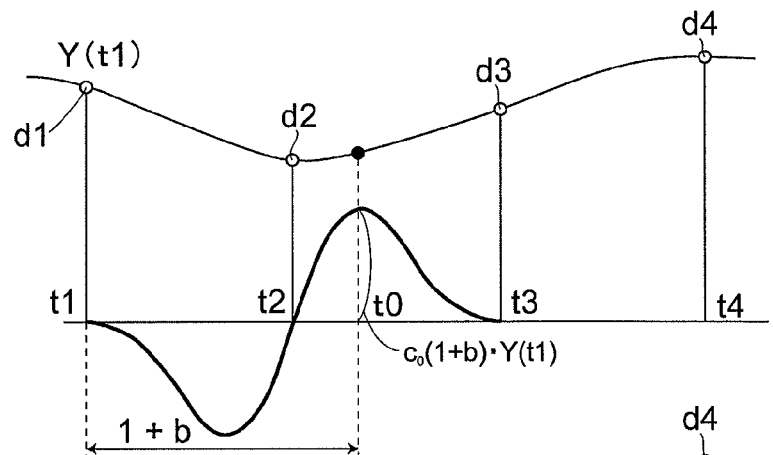
FIG. 7 is a schematic view illustrating an interpolation process using the control sampling function, which is performed by a sound processing means 2, according to the present invention.

Focusing on a value Y(t1) of the discrete data d1 at the sampling position t1 shown in FIG. 7(A), a distance between the interpolation position t0 and the sampling position t1 becomes 1+b. Accordingly, a value of the control sampling function $c_0$(t) at the interpolation position t0 when allowing the central position of the control sampling function $c_0$(t) to coincide with the sampling position t1 becomes $c_0$(1+b). Practically, the waveform height of the control sampling function $c_0$(t) is adjusted so as to be allowed to correspond to the value Y(t1) of the discrete data d1 and hence a value of $c_0$(1+b)·Y(t1), produced by multiplying $c_0$(1+b) described above by Y(t1), becomes a desired value. The calculation of $c_0$(1+b) is performed in the control term calculation circuit 22$a$ of the control term calculation means 17, while the calculation of multiplying $c_0$(1+b) by Y(t1) is performed in a control term multiplying circuit 25$a$ of the control term calculation means 17 (see FIG. 5).

Figure 7B:
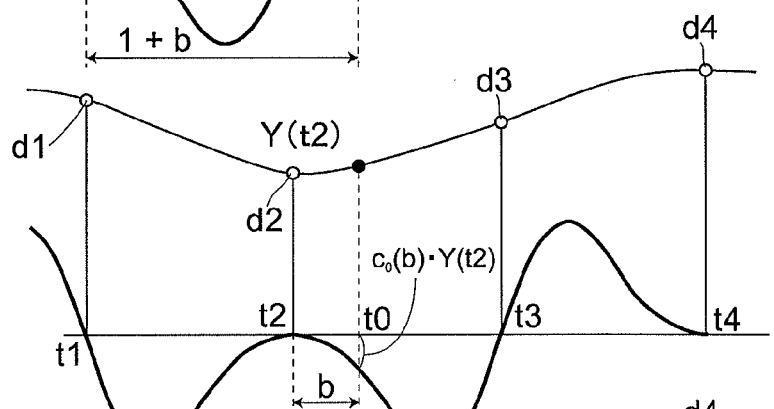

Similarly, focusing on a value Y(t2) of the discrete data d2 at the sampling position t2 shown in FIG. 7(B), a distance between the interpolation position t0 and the sampling position t2 becomes b. Accordingly, a value of the control sampling function $c_0$(t) at the interpolation position t0 when allowing the central position of the control sampling function $c_0$(t) to coincide with the sampling position t2 becomes $c_0$(b). Practically, the waveform height of the control sampling function $c_0$(t) is adjusted so as to be allowed to correspond to the value Y(t2) of the discrete data d2 and hence a value of $c_0$(b)·Y(t2), produced by multiplying $c_0$(b) described above by Y(t2), becomes a desired value. The calculation of $c_0$(b) is performed in the control term calculation circuit 22b of the control term calculation means 17, while the calculation of multiplying $c_0(b)$ by $Y(t2)$ is performed in a control term multiplication circuit 25b of the control term calculation means 17 (see FIG. 5).

Figure 7C:
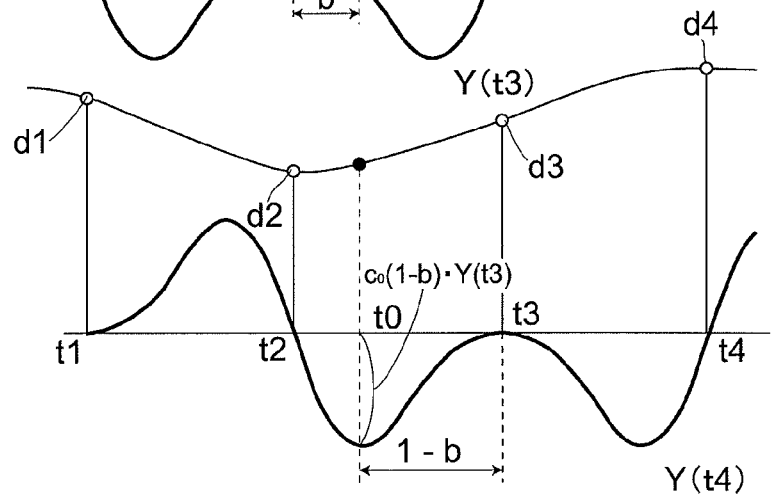

Focusing on a value $Y(t3)$ of the discrete data d3 at the sampling position t3 shown in FIG. 7(C), a distance between the interpolation position t0 and the sampling position t3 becomes 1−b. Accordingly, a value of the control sampling function $c_0(t)$ at the interpolation position t0 when allowing the central position of the control sampling function $c_0(t)$ to coincide with the sampling position t3 becomes $c_0(1-b)$. Practically, the waveform height of the control sampling function $c_0(t)$ is adjusted so as to be allowed to correspond to the value $Y(t3)$ of the discrete data d3 and hence a value of $c_0(1-b) \cdot Y(t3)$, produced by multiplying $c_0(1-b)$ described above by $Y(t3)$, becomes a desired value. The calculation of $c_0(1-b)$ is performed in the control term calculation circuit 22c of the control term calculation means 17, while the calculation of multiplying $c_0(1-b)$ by $Y(t3)$ is performed in a control term multiplication circuit 25c of the control term calculation means 17 (see FIG. 5).

Figure 7D:
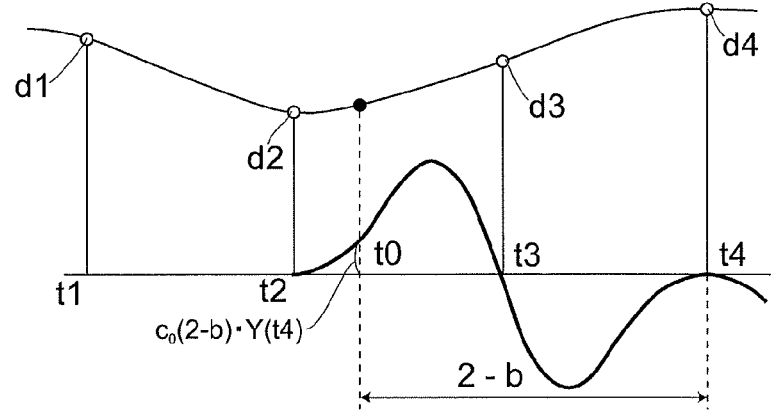

Focusing on a value $Y(t4)$ of the discrete data d4 at the sampling position t4 shown in FIG. 7(D), a distance between the interpolation position t0 and the sampling position t4 becomes 2−b. Accordingly, a value of the control sampling function $c_0(t)$ at the interpolation position t0 when allowing the central position of the control sampling function $c_0(t)$ to coincide with the sampling position t4 becomes $c_0(2-b)$. Practically, the waveform height of the control sampling function $c_0(t)$ is adjusted so as to be allowed to correspond to the value $Y(t4)$ of the discrete data d4 and hence a value of $c_0(2-b) \cdot Y(t4)$, produced by multiplying $c_0(2-b)$ described above by $Y(t4)$, becomes a desired value. The calculation of $c_0(2-b)$ is performed in the control term calculation circuit 22d of the control term calculation means 17, while the calculation of multiplying $c_0(2-b)$ by $Y(t4)$ is performed in a control term multiplying circuit 25d of the control term calculation means 17 (see FIG. 5).

Then, using a control term convolution operation circuit 26, the control term calculation means 17 applies the convolution operation to the four values $c_0(1+b) \cdot Y(t1)$, $c_0(b) \cdot Y(t2)$, $c_0(1-b) \cdot Y(t3)$, $c_0(2-b) \cdot Y(t4)$ which are obtained corresponding to the marked point of the interpolation position t0 and thereafter the results of the convolution operation are multiplied by the variable parameter α by means of the coefficient multiplication means 18 to thereby calculate a control interpolation value yb corresponding to the marked point. In addition, a calculation performed by the whole of the control term calculation means 17 is the convolution operation, whereas the control term convolution operation circuit 26 simply adds the multiplied results in each of the control term multiplication circuits 25a to 25d.

(3-2-3) Interpolation Value Calculation Process

The linear adding means 19 linearly adds the fundamental interpolation value ya which is calculated by the fundamental term calculation means 16 and corresponds to the marked point and the control interpolation value yb which is calculated by the control term calculation means 17 and the coefficient multiplication means 18 and corresponds to the marked point. As a result, an interpolation value y at the interpolation position t0 can be output.

(3-3) Interpolation Process Result when a Value of the Variable Parameter is Varied In addition to such a configuration, in the sound processing means 2, a value of the variable parameter α in the coefficient multiplication means 18 is varied by the parameter setting unit 7 and thereby a value of the sampling function $s_N(t)$ is changed. As a result, the interpolation value y alters, enabling a frequency characteristic of analogue signals to be varied. Now, it is described hereunder, focusing on a waveform produced by synthesizing a waveform exhibited by the fundamental sampling function f(t) shown in FIG. 1 and a waveform exhibited by the control sampling function $c_0(t)$, how the sampling function $s_N(t)$ varies when the variable parameter α is changed.

Figure 8:
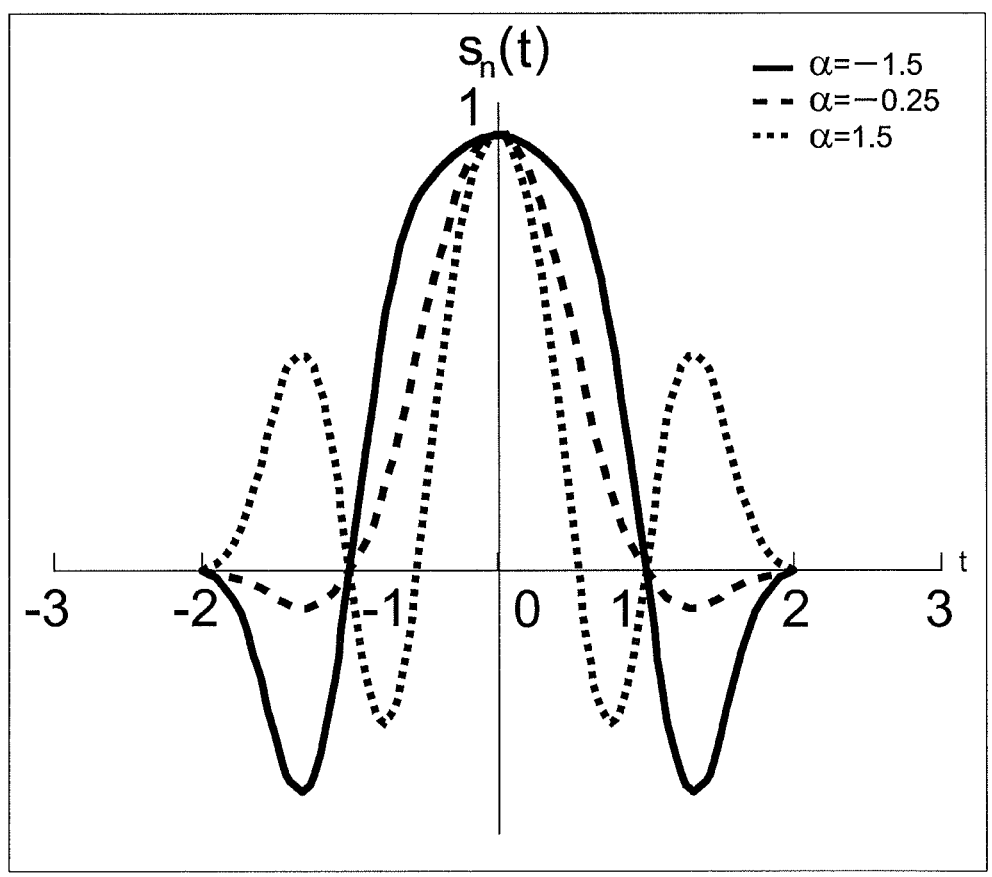
FIG. 8 is a schematic view illustrating waveforms of the sampling function when a variable parameter is varied.

A waveform of the sampling function $s_N(t)$ produced by synthesizing the waveform exhibited by the fundamental sampling function f(t) and the waveform exhibited by the control sampling function $c_0(t)$ is, as shown in FIG. 8, considerably different according to a value of the variable parameter a. In the present embodiment, it was verified that when sequentially varying the variable parameter α in the order of −1.5, −0.25, 1.5, the amplitude of a wavelength of the sampling function $s_N(t)$ gradually increased both in a region of −2≤t≤−1 and in a region of 1≤t≤2, so that the polarity of the waveform was inverted. On the other hand, it was verified that the amplitude of the wavelength of the sampling function $s_N(t)$ gradually decreased both in a region of −1≤t≤0 and in a region of 0≤t≤1, so that the polarity of the waveform was inverted.

Next, as a test piece, the piece for violin "Zigeunerweisen" recorded on a CD was reproduced for about 23 seconds in the audio apparatus 1, At this time, in the sound processing means 2, the variable parameter α was set at −0.25, −1.5 and 1.5 to interpolate the discrete data input for about 23 seconds. The frequency characteristics of the analogue signals interpolated at this time by each of the sampling functions $s_N(t)$ were compared to one another and then the results shown in FIG. 9 were obtained.

Figure 9:
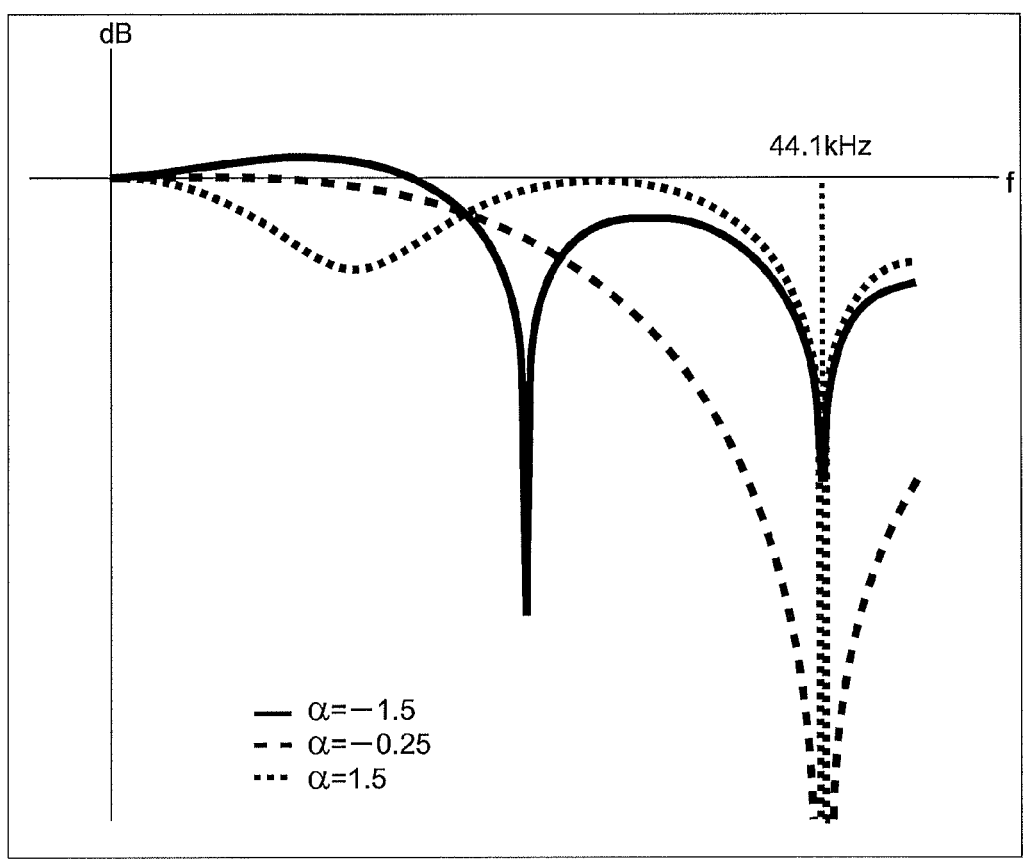
FIG. 9 is a schematic view illustrating frequency characteristics when a variable parameter is varied.

As shown in FIG. 9, in the interpolation process using each of the sampling functions $s_N(t)$ in which these values of the variable parameter α were varied, it was verified that even if the value of the variable parameter α was varied, at any values of the variable parameter α, the signal level increased at a high-frequency range not less than 20 kHz and as a result, high-frequency components could be reproduced as compared to the case where the traditional Shannon's sampling function was used. Further, it was also verified that when the variable parameter α was set at 1.5, the signal level decreased at frequencies less than about 26 kHz, the signal level, however, increased at higher-frequencies not less than 26 kHz except at the vicinity of 44.1 kHz and higher-frequency components could be reproduced as compared to the case where the variable parameter α was set at −0.25 and −1.5.

On the other hand, it was verified that when the variable parameter α was set at −1.5, the signal level sharply decreased in the vicinity of about 26 kHz, and the signal level, however, increased as a whole at frequencies less than 26 kHz and besides the signal level increased at higher frequencies than 26 kHz except at the vicinity of 44.1 kHz and then as a result, high-frequency components could be reproduced at a different signal level as compared to the case where the variable parameter α was set at −0.25 and −1.5.

Further, it was verified that when the variable parameter α was set at −0.25, the signal level increased as a whole except at the vicinity of 44.1 kHz and as a result, high-frequency components could be reproduced at a different signal level as compared to the case where the variable parameter α was set at 1.5 and −1.5.

Next, as test pieces, its sounds whose reproducing frequencies were fixed at 10 kHz and 20 kHz were reproduced in the audio apparatus 1. At this time, in the sound processing means 2, the value of the variable parameter α was switched in the range of −5 to 5 in series to interpolate the discrete data input in series from the input unit 6. Then, the signal levels of analogue signals obtained by interpolating discrete data with each of the sampling functions $s_N(t)$ different in the variable parameter α was compared to one another and then the results shown in FIG. 10 was obtained.

Figure 10:
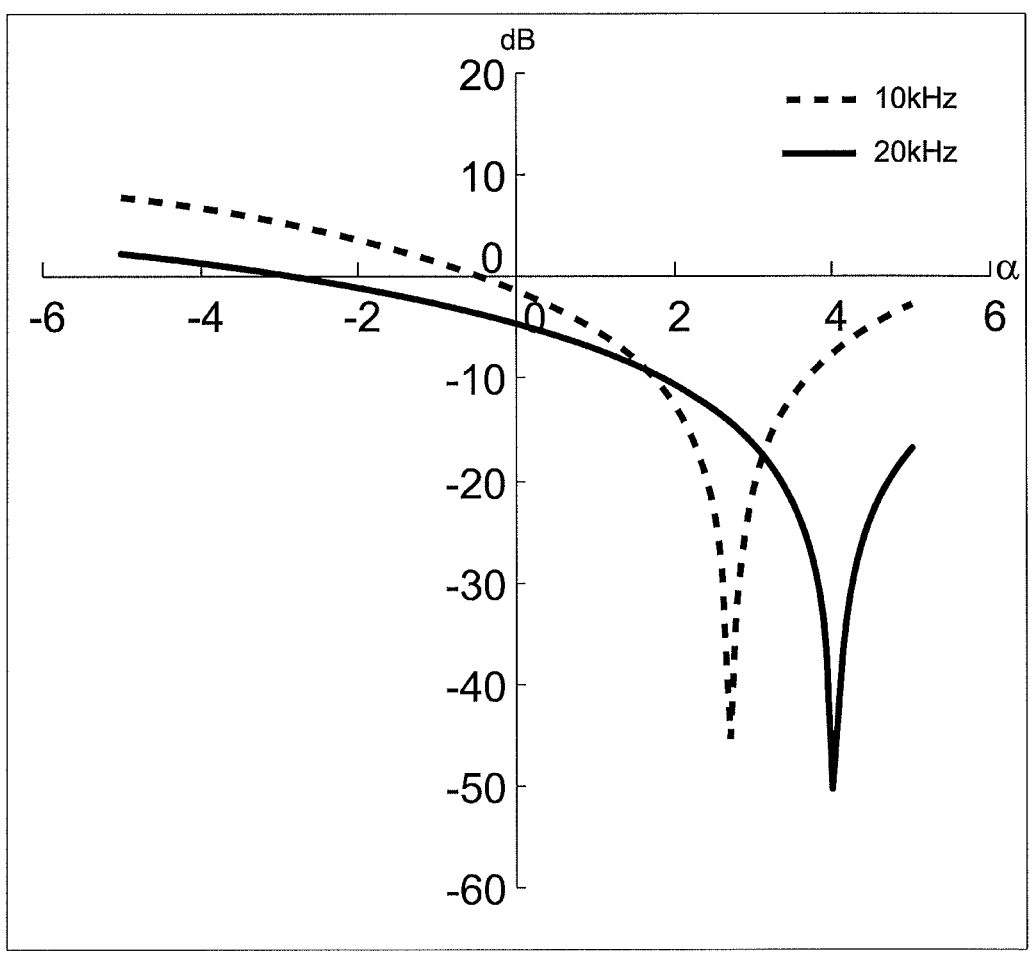
FIG. 10 is a schematic view illustrating signal levels when a numerical value of a variable parameter is varied with a reproduced frequency fixed.

As shown in FIG. 10, it was verified that in the case of the reproducing frequency of 10 kHz, when the variable parameter α is allowed to continue to increase, the signal level gradually decreased, and when the variable parameter α was between 2 and 3, the signal level rapidly decreased and thereafter sharply increased again. On the other hand, it was verified that in the case of the reproducing frequency of 20 kHz, when the variable parameter α was allowed to continue to increase, the signal level gradually decreased and when the variable parameter α was at the vicinity of 4, the signal level rapidly decreased and thereafter sharply increased again. Thus, in the sound processing means 2, by varying the variable parameter α, even at the same reproducing frequency, the analogue signals could be reproduced at a different signal level.

(4) Behavior and Effect

In the scheme described above, in the sound processing means 2, the fundamental sampling function f(t) is stored in the fundamental term calculation means 16 in advance and the distance to the interpolation position t0 is defined as t for each of the discrete data d1, d2, d3, d4 extracted by the discrete data extraction means 15 to calculate a value of the fundamental sampling function f(t) and then apply the convolution operation to the values of the fundamental sampling function f(t) allowed to correspond to each of the discrete data d1, d2, d3, d4, thereby calculating the fundamental interpolation value ya at the interpolation position W.

Further, aside from this, in the sound processing means 2, the control sampling function $c_0(t)$ is stored in the control term calculation means 17 in advance and the distance to the interpolation position t0 is defined as t for each of the discrete data d1, d2, d3, d4 extracted by the discrete data extraction means 15 to calculate a value of the control sampling function $c_0(t)$ and then apply the convolution operation to the values of the control sampling function $c_0(t)$ allowed to correspond to each of the discrete data d1, d2, d3, d4 and thereafter by multiplying the results of the convolution operations of the control sampling function $c_0(t)$ by the variable parameter α set as an arbitrary value by a user, thereby calculating the control interpolation value yb at the interpolation position t0.

Then, in the sound processing means 2, by linearly adding the fundamental interpolation value ya and the control interpolation value yb, the interpolation value y among the discrete data is calculated. As a result, the interpolation value y can be calculated which is reflected by the value of the variable parameter α by which the control sampling function $c_0(t)$ is multiplied Accordingly, in the sound processing means 2, by varying the value of the variable parameter α, the interpolation value y obtained by the interpolation process performed by the sampling function $s_N(t)$ can be regulated depending on the variable parameter α. Thus, a user varies appropriately the variable parameter α depending on music reproduction environments, sound sources, musical tones or the like, thereby making it possible to reproduce high-quality-sound music with a sound quality, desired by a user, whose frequency characteristic of analogue signals is regulated.

Further, in the sound processing means 2, using the fundamental sampling function f(t) and the control sampling function $c_0(t)$ which are only once differentiable in their whole ranges as the sampling function $s_N(t)$ and have finite support, the control sampling function $c_0(t)$ is multiplied by the variable parameter α. Hence, a calculation amount required for the interpolation process among the discrete data can be significantly reduced as compared to the case where the traditional Shannon's sampling function is used and further the truncation error does not occur which is generated in the case of using Shannon's sampling function, thus permitting aliasing distortion to be prevented from occurring.

In the present embodiment, a value of the waveform of the sampling function $s_N(t)$ can be converged to 0 at a range between each set of ambilateral two sampling positions particularly sandwiching the interpolation position t0 or in a narrower range than the above range. Hence, when performing a data interpolation process or the like using this sampling function $s_N(t)$, each set of the ambilateral two discrete data of the marked point, that is, the use of only total four discrete data may be sufficient for the interpolation process, thus enabling a processing burden to be markedly reduced as compared to the case where Shannon's sampling function is used.

Further, in the present embodiment, the sampling function $s_N(t)$ is separated into the fundamental sampling function f(t) and the control sampling function $c_0(t)$ and thereby the two functions are separately stored and then each of the functions applies the convolution operation individually to the discrete data. Then, the calculated results of the convolution operations between the control sampling function $c_0(t)$ and the discrete data are multiplied by the variable parameter α to add the multiplied results of the convolution operations between the sampling function $s_N(t)$ and the discrete data to the above multiplied results and thereby obtain output signals. Hence, only one control sampling function $c_0(t)$ may be sufficient to enable formulae to be simplified as much as possible, permitting the variable control of the sampling function $c_0(t)$ to be easily performed.

(5) Other Embodiment

In addition, in the above embodiment, it has been described that a plurality of interpolation values among the discrete data is calculated one by one in series by the fundamental term calculation means 16 and the control term calculation means 17. The present invention, however, is not limited to this scheme and a plurality of the interpolation values among the discrete data may be calculated in a lump.

Figure 11:
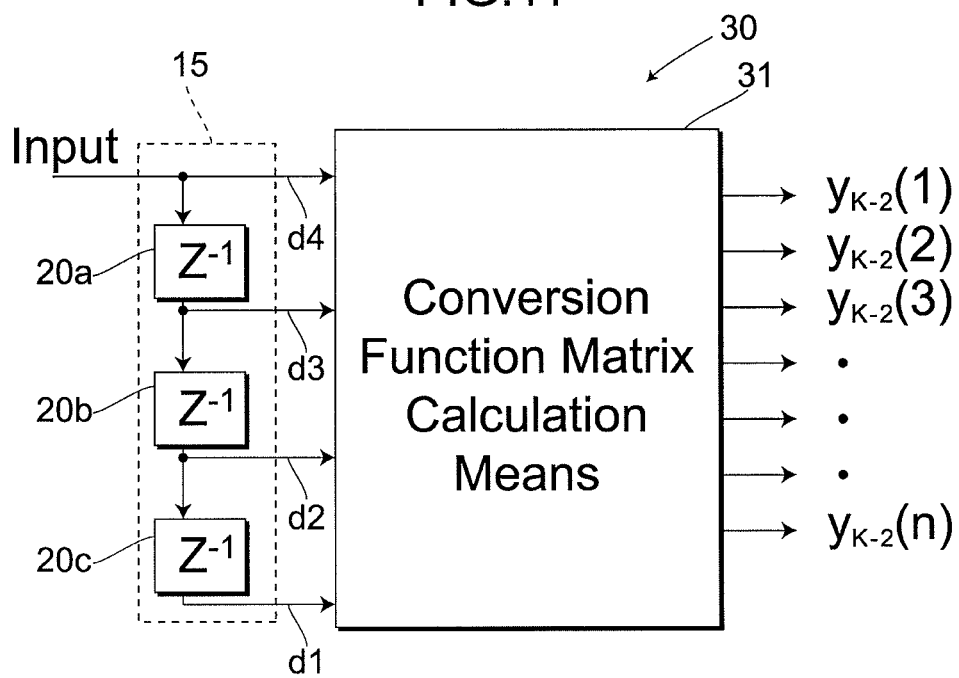
FIG. 11 is a block diagram illustrating a circuit configuration of a sound processing means according to other embodiment.

In this case, as shown in FIG. 11 showing its contents with the same reference symbols attached to portions the same as in FIG. 5, a sound processing means 30 comprises the discrete data extraction means 15 and a conversion function matrix calculation means 31. In the conversion function matrix calculation means 31, by multiplying values Y(t1), Y(t2), Y(t3), Y(t4) of the discrete data d1, d2, d3, d4, respectively and a conversion matrix A (described below), a plurality of interpolation values $y_{k-2}(1)$, $y_{k-2}(2)$, . . . , $y_{k-2}(n)$ among the discrete data can be calculated in series or in a lump.

Figure 12:
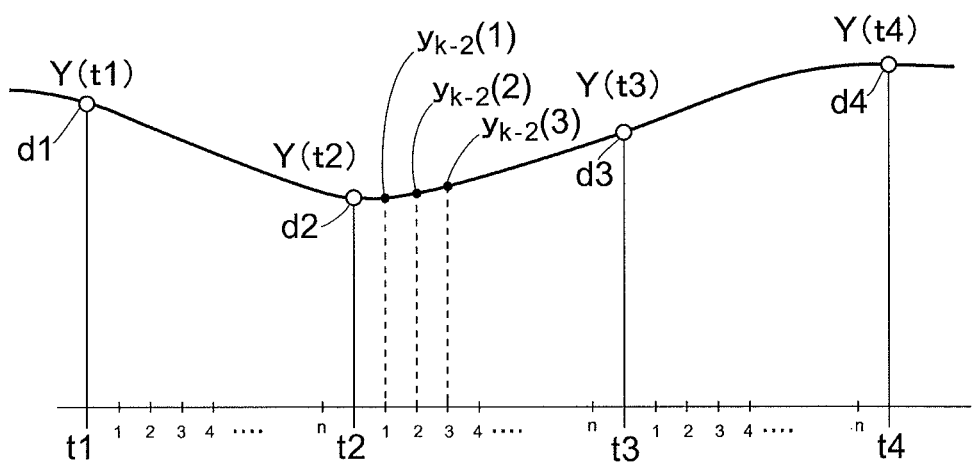
FIG. 12 is a schematic view illustrating a positional relationship between four discrete data and a marked point, and interpolation positions.

For reference's sake, in this embodiment, it is described below that as shown in FIG. 12 showing its contents with the same reference symbols attached to corresponding portions in FIG. 4, among the four continuous discrete data d1, d2, d3, d4, a position between the second last discrete data d2 and the third last discrete data d3 is partitioned into up to 1−n to section the position with a given sectioned number (in this case, n+1) and then calculate the interpolation values $y_{k-2}(1)$, $y_{k-2}(2)$, . . . , $y_{k-2}(n)$ at each position.

Here, the conversion matrix A is expressed by the following formula 10.

$$A = \begin{bmatrix} S_1(n+1)S_2(1)S_3(n-1)S_4(2n-1) \\ S_1(n+2)S_2(2)S_3(n-2)S_4(2n-2) \\ S_1(n+3)S_2(3)S_3(n-3)S_4(2n-3) \\ \vdots \\ S_1(2n)S_2(n)S_3(0)S_4(n) \end{bmatrix} \quad \text{[Formula 10]}$$

This conversion matrix A calculates the sampling function $s_N(t)$ using the four discrete data d1, d2, d3, d4 and further calculates n pieces of interpolation values $y_{k-2}(1)$, $y_{k-2}(2)$, ..., $y_{k-2}(n)$ among the discrete data d2 and d3. Hence, the conversion matrix A comprises n rows and 4 columns with the sampling function $s_N(t)$ defined as elements. Then, the conversion matrix A is multiplied by a matrix X of one column having, as its elements, the values Y(t1), Y(t2), Y(t3), Y(t4) of the discrete data d1, d2, d3, d4 to thereby enable the interpolation values $y_{k-2}(1)$, $y_{k-2}(2)$, ..., $y_{k-2}(n)$ to be determined. Namely, the interpolation values $y_{k-2}(1)$, $y_{k-2}(2)$, ..., $y_{k-2}(n)$ can be determined by the following formula 11.

$$\begin{bmatrix} y_{k-2}(1) \\ y_{k-2}(2) \\ y_{k-2}(3) \\ \vdots \\ y_{k-2}(n) \end{bmatrix} = AX \quad \text{[Formula 11]}$$

$$= \begin{bmatrix} S_1(n+1)S_2(1)S_3(n-1)S_4(2n-1) \\ S_1(n+2)S_2(2)S_3(n-2)S_4(2n-2) \\ S_1(n+3)S_2(3)S_3(n-3)S_4(2n-3) \\ \vdots \\ S_1(2n)S_2(n)S_3(0)S_4(n) \end{bmatrix} \begin{bmatrix} Y(t1) \\ Y(t2) \\ Y(t3) \\ Y(t4) \end{bmatrix}$$

Here, the conversion matrix A is the sum of the fundamental term matrix B expressed by the following formula 11 and control term matrix C expressed by the following formula 13 multiplied by the variable parameter α and therefore the conversion matrix A is expressed by A=B+αC.

$$B = \begin{bmatrix} f_1(n+1)f_2(1)f_3(n-1)f_4(2n-1) \\ f_1(n+2)f_2(2)f_3(n-2)f_4(2n-2) \\ f_1(n+3)f_2(3)f_3(n-3)f_4(2n-3) \\ \vdots \\ f_1(2n)f_2(n)f_3(0)f_4(n) \end{bmatrix} \quad \text{[Formula 12]}$$

$$C = \begin{bmatrix} c_1(n+1)c_2(1)c_3(n-1)c_4(2n-1) \\ c_1(n+2)c_2(2)c_3(n-2)c_4(2n-2) \\ c_1(n+3)c_2(3)c_3(n-3)c_4(2n-3) \\ \vdots \\ c_1(2n)c_2(n)c_3(0)c_4(n) \end{bmatrix} \quad \text{[Formula 13]}$$

The fundamental sampling function f(t) acts as the elements of the fundamental term matrix B, while the control sampling function c(t) acts as the elements of the control term matrix C (t demotes a distance between an interpolation point and a sampling position). Accordingly, the interpolation values $y_{k-2}(1)$, $y_{k-2}(2)$, ..., $y_{k-2}(n)$ are expressed by the following formula 14.

$$\begin{bmatrix} y_{K-2}(1) \\ y_{K-2}(2) \\ y_{K-2}(3) \\ \vdots \\ y_{K-2}(n) \end{bmatrix} = \begin{bmatrix} S_1(n+1)S_2(1)S_3(n-1)S_4(2n-1) \\ S_1(n+2)S_2(2)S_3(n-2)S_4(2n-2) \\ S_1(n+3)S_2(3)S_3(n-3)S_4(2n-3) \\ \vdots \\ S_1(2n)S_2(n)S_3(0)S_4(n) \end{bmatrix} \quad \text{[Formula 14]}$$

$$\begin{bmatrix} Y(t1) \\ Y(t2) \\ Y(t3) \\ Y(t4) \end{bmatrix}$$

$$= \begin{bmatrix} f_1(n+1)f_2(1)f_3(n-1)f_4(2n-1) \\ f_1(n+2)f_2(2)f_3(n-2)f_4(2n-2) \\ f_1(n+3)f_2(3)f_3(n-3)f_4(2n-3) \\ \vdots \\ f_1(2n)f_2(n)f_3(0)f_4(n) \end{bmatrix} \begin{bmatrix} Y(t1) \\ Y(t2) \\ Y(t3) \\ Y(t4) \end{bmatrix} +$$

$$\alpha \begin{bmatrix} c_1(n+1)c_2(1)c_3(n-1)c_4(2n-1) \\ c_1(n+2)c_2(2)c_3(n-2)c_4(2n-2) \\ c_1(n+3)c_2(3)c_3(n-3)c_4(2n-3) \\ \vdots \\ c_1(2n)c_2(n)c_3(0)c_4(n) \end{bmatrix} \begin{bmatrix} Y(t1) \\ Y(t2) \\ Y(t3) \\ Y(t4) \end{bmatrix}$$

Figure 13:
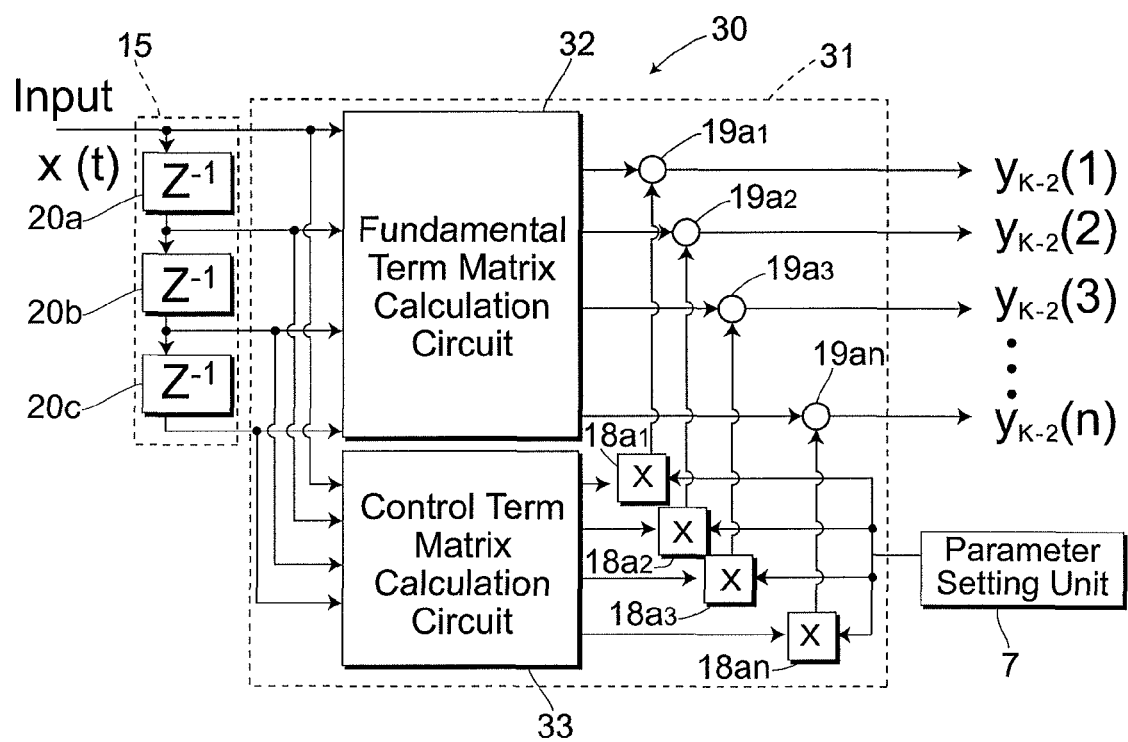
FIG. 13 is a block diagram illustrating a detailed configuration of the sound processing means according to other embodiment.

Practically, the conversion function matrix calculation means 31 comprises, as shown in FIG. 13, a fundamental term matrix calculation circuit 32 acting as a fundamental term calculation means for calculating the fundamental term matrix B and the matrix X, a control term matrix calculation means 33 acting as a control term calculation means for calculating the control term matrix C and the matrix X, a plurality of coefficient multiplication means 18a1, 18a2, ..., 18an for multiplying the calculated results of the control term matrix calculation means 33 by the variable parameter α, and a plurality of the linear adding means 19a1, 19a2, ..., 19an for linearly adding the calculated results from the fundamental term matrix calculation circuit 32 and the calculated results from the coefficient multiplication means 18a1, 18a2, ..., 18an.

The fundamental term matrix calculation circuit 32 calculates in advance the fundamental term matrix B acting as the fundamental sampling function, depending on a sectioned number among the discrete data and then stores the fundamental matrix B created by tabulating the calculated values thus obtained in a given storage means. Then, when receiving the discrete data d1, d2, d3, d4 from the discrete data extraction means 15, the fundamental term matrix calculation circuit 32 multiplies the fundamental term matrix B acting as the tabulated value stored in advance in a given storage means by the values Y(t1), Y(t2), Y(t3), Y(t4) of the discrete data d1, d2, d3, d4, with the values of the discrete data defined as a matrix X of one row. Afterward, the fundamental term matrix calculation circuit 32 delivers values of each column of the matrix obtained by the multiplied results to the corresponding linear adding means 19a1, 19a2, . . . , 19an. Specifically, the fundamental term matrix calculation circuit 32 delivers the first column of the matrix obtained as the calculated result, $\{f_1(n+1)\cdot Y(t1)\}+\{f_2(1)\cdot Y(t2)\}+\{f_3(n-1)\cdot Y(t3)\}+\{f_4(2n-1)\cdot Y(t4)\}$ to the linear adding means 19a1 and delivers the second column of the matrix, $\{f_1(n+2)\cdot Y(t1)\}+\{f_2(2)\cdot Y(t2)\}+\{f_3(n-2)\cdot Y(t3)\}+\{f_4(2n-2)\sim Y(t4)\}$ to the linear adding means 19a2 and afterward delivers each of values in the third to an n-th column to each of the linear adding means 19a, . . . , 19an.

On the other hand, the control term matrix calculation circuit 33 calculates in advance the control term matrix C, acting as the control sampling function, depending on the sectioned number among the discrete data and then stores the control matrix C created by tabulating the calculated values thus obtained in a given storage means. Then, when receiving the discrete data d1, d2, d3, d4 from the discrete data extraction means 15, the control term matrix calculation circuit 33 multiplies the control term matrix C, acting as the tabulated value stored in advance in a given storage means, by the values Y(t1), Y(t2), Y(t3), Y(t4) of the discrete data d1, d2, d3, d4, with the values of the discrete data defined as a matrix X of one row. Afterward, the control term matrix calculation circuit 33 delivers each of column values of the matrix obtained by the multiplied results to the corresponding coefficient multiplication means 18a1, 18a2, . . . , 18an. Specifically, the control term matrix calculation circuit 33 delivers the first column of the matrix obtained as the calculated result, $\{c_1(n+1)\cdot Y(t1)\}+\{c_2(1)\cdot Y(t2)\}+\{c_3(n-1)\cdot Y(t3)\}+\{c_4(2n-1)\cdot Y(t4)\}$ to the coefficient multiplication means 18a1 and delivers the second column of the matrix, $\{c_1(n+2)\cdot Y(t1)\}+\{c_2(2)\cdot Y(t2)\}+\{c_3(n-2)\cdot Y(t3)\}+\{c_4(2n\cdot 2)\cdot Y(t4)\}$ to the coefficient multiplication means 18a2 and afterward delivers each of values in the third to the n-th column to the coefficient multiplication means 18a3, . . . , 18an.

Each of the coefficient multiplication means 18a1, 18a2, . . . , 18an multiplies each value of the columns of the matrix calculated in the control term matrix calculation circuit 33 by the variable parameter α set by a user in the parameter setting unit 7 to deliver the multiplied values to the corresponding linear adding means 19a1, 19a2, . . . , 19an. Each of the linear adding means 19a1, 19a2, . . . , 19an linearly adds the calculated results received from the fundamental term matrix calculation circuit 32 and the calculated results received from the coefficient multiplying calculation means 18a1, 18a2, . . . , 18an, thereby permitting the interpolation values $y_{k-2}(1), y_{k-2}(2), \ldots, y_{k-2}(n)$ to be produced.

In the scheme described above, in the sound processing means 30, in addition to the effect the same as in the above embodiment, the fundamental term matrix B is stored in the fundamental term matrix calculation circuit 32 and besides the control term matrix C is stored in the control term matrix calculation circuit 33. Then, the values Y(t1), Y(t2), Y(t3), Y(t4) of the discrete data d1, d2, d3, d4 are subjected to multiplication as the matrix X of one row. Hence, the interpolation values $y_{k-2}(1), y_{k-2}(2), \ldots, y_{k-2}(n)$ existing among the interpolation positions 1 to n between given discrete data d2 and d3 among the continuous four discrete data d1, d2, d3, d4 can be easily calculated in a lump.

In addition, in the above embodiment, it has been described that the fundamental term matrix B and the control term matrix C were used which were applicable to only the discrete data sequence in which the sectioned number among the marked discrete data was n+1 that is a constant value. The present invention, however, is not limited to this case and a fundamental term matrix and a control term matrix may be used which are applicable to a plurality of discrete data sequences different in sectioned number among the marked discrete data. Specifically, in this case, in the conversion function matrix calculation means, in order apply to a plurality of the discrete data sequences different in sectioned number, the fundamental term matrix B and the control term matrix C are calculated in advance using a sectioned number of the lowest common multiple in a plurality of sectioned numbers to be tabulated. Then, according to the sectioned number set at the start of inputting the discrete data, a calculated value corresponding to the sectioned number is selected as a tabulated number from among the fundamental term matrix B and the control term matrix C and thereafter the convolution operation is applied between the selected tabulated value and the discrete data. As a result, the conversion function matrix calculation means has stored only one set of the fundamental term matrix B and control term matrix C in advance, thereby making it possible to correspond to a plurality of the discrete data sequences different in the sectioned number. Hence, the storage capacity in a storage means can be reduced, permitting a processing burden in the whole of the apparatus to be decreased.

Further, the present invention is not limited to the present embodiment and various modifications are possible within the scope of the gist of the present invention. For example, as the sampling function $s_N(t)$, a piecewise polynomial of finite support only once differentiable in the whole range has been used. However, the number of times of differentiability may be set twice or more.

Furthermore, in the above embodiment, it has been described that the sampling function $s_N(t)$ was used to perform the interpolation process, producing the analogue signals. The present invention is not limited to this case and an oversampling process is simply performed by performing the interpolation process using the sampling function $s_N(t)$ and thereafter the analogue signals may be produced by means of an digital-to-analogue conversion device.

Moreover, in the above embodiment, it has been described that the sampling function $s_N(t)$ was allowed to converge to 0 at $t=\pm 2$. The present invention is, however, not limited to this case and the sampling function $s_N(t)$ may be allowed to converge to 0 at $t=\pm 3$ or more. For example, when doing so, the last six discrete data are extracted by the discrete data extraction means 15 and thereby the values of the sampling function $s_N(t)$ can be calculated for these six discrete data by the function processing means 14.

Further, in the above embodiment, it has been described that the fundamental sampling function f(t) is stored in the fundamental term calculation means 16 and aside from this, the control sampling function $c_0(t)$ is stored in the control term calculation means 17 in advance. Then, the convolution operation is applied to the discrete data d1, d2, d3, d4 for each of the fundamental sampling function f(t) and control sampling function $c_0(t)$ to calculate the fundamental interpolation value ya and the control interpolation value yb and thereafter the fundamental interpolation value ya and the control interpolation value yb are linearly added to calculate the interpolation value y. The present invention is, however, not limited to this case. The fundamental sampling function f(t) and the control sampling function $c_0(t)$ may be stored as one sampling function $s_N(t)$ in advance and using a sampling function $s_N(t)$ in which the variable parameter α is varied, the convolution operation may be applied to the discrete data d1, d2, d3, d4 to calculate directly the interpolation value y.

In this case, as a specified configuration, the function processing means stores the sampling function $s_N(t)$ produced by linearly adding the fundamental sampling function f(t) and the control sampling function $c_0(t)$ in advance and may includes a calculation means for calculating a value of the sampling function $s_N(t)$ using a distance to the marked point determined for each of the discrete data and the convolution operation means for calculating an interpolation value at the marked point by applying the convolution operation to the sampling function $s_N(t)$ allowed to correspond to each of the discrete data. As a result, in the function processing means, the sampling function $s_N(t)$ is calculated in advance and hence the number of times of multiplication is reduced as compared to a case where the fundamental sampling function f(t) and the control sampling function $c_0(t)$ are independently calculated and thereby the number of times of multiplication is reduced and hence the number of times of calculation and the number of multipliers can be reduced, thus leading to the adaptability when a low-speed calculating device is used.

Second Embodiment

Next, a second embodiment different from the first embodiment discussed above is explained hereinafter. Here, instead of using the aforementioned FIG. 1 to 7, FIG. 10 to 13, new drawings are used for explanation. In the following drawings, although reference numbers identical to those in FIG. 1 to 7, FIG. 10 to 13 are found, such reference numbers are specifically provided to describe the configuration of an audio device according to the second embodiment explained hereinafter.

(1) Overall Configuration of the Audio Device

Figure 14:
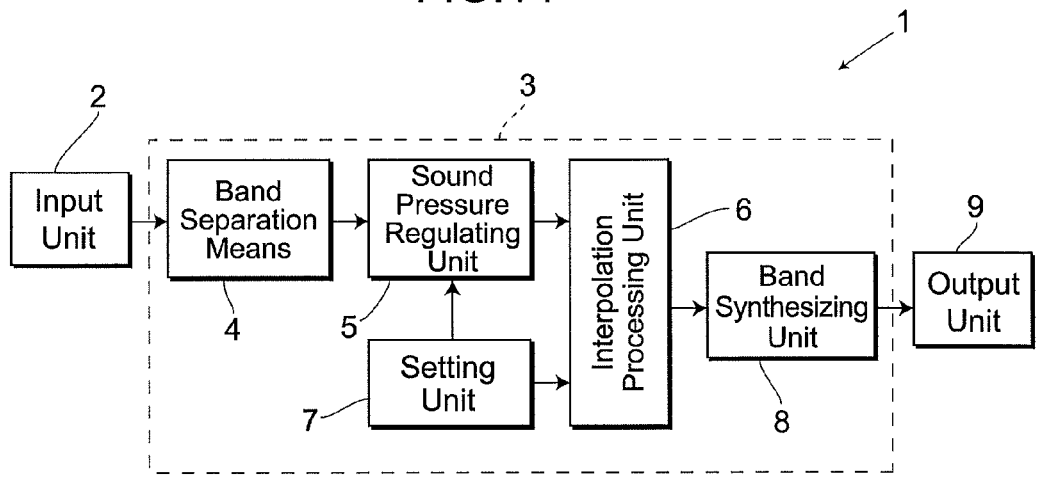
FIG. 14 is a block diagram illustrating a circuit configuration of an audio apparatus according to a second embodiment.

In FIG. 14, reference number 1 is the whole of an audio device comprising a sound processing unit 3 according to the present invention. This audio device 1 reproduces various recording media including CD, DVD and so on by means of an input unit 2, and sequentially sends out to a sound processing unit 3 a plurality of discrete data thus obtained and temporally-ordered. In fact, the discrete data is obtained by, for example, sampling at constant time interval continuous signals which vary smoothly, and quantizing the sampling data thus obtained.

The sound processing unit 3 acting as a sound processing apparatus comprises: a band separation means 4 for separating the discrete data into three frequency bands including, for example, a low-frequency range, an mid-frequency range and a high-frequency range; a sound pressure regulating unit 5 for regulating the sound pressure level with respect to the three frequency bands of the low-frequency range, the mid-frequency range and the high-frequency range; an interpolation processing unit 6 for individually performing interpolation with respect to each frequency band using a predetermined sampling function (explained later) individually set for each frequency band; a setting unit 7 which allows the user to freely set a sound pressure level and the sampling function with respect to each frequency band; and a band synthesizing unit 8 for producing an analog signal acting as a synthesized signal by synthesizing interpolation processed signal produced with respect to each frequency band.

Figure 15:
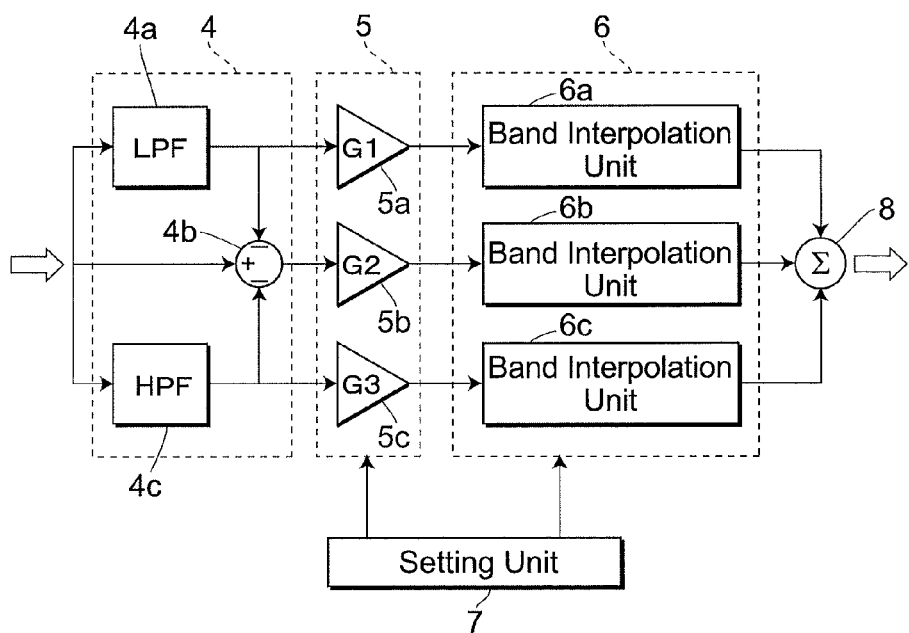
FIG. 15 is a block diagram illustrating a circuit configuration of a sound processing means according to a second embodiment.

In fact, as shown in FIG. 15, the sound processing unit 3 has a band separation means 4 comprising a digital low-pass filter 4a, a digital band-pass filter 4b and a digital high-pass filter 4c, and is capable of separating the discrete data into the frequency bands of the low-frequency range, the mid-frequency range and the high-frequency range. Further, although this embodiment describes a case in which FIR (Finite duration Impulse Response) filter is employed as the digital low-pass filter 4a, the digital band-pass filter 4b and the digital high-pass filter 4c, the present invention is not limited to such a configuration and various kinds of other digital filters such as IIR (Infinite Impulse Response) filter may also be employed.

The band separation means 4 produces a band-by-band signal of the low-frequency range in which a high-frequency range component has been removed, by capturing a predetermined number of the discrete data by means of the digital low-pass filter 4a and averaging the discrete data thus captured. The band separation means 4 then sends out such a band-by-band signal to the sound pressure regulating unit 5 and the digital band-pass filter 4b.

The digital high-pass filter 4c produces from the discrete data a band-by-band signal of the high-frequency range in which a preset low-frequency range component has been removed, by adding or subtracting the discrete data and a newly inputted discrete data with a preset weighting ratio. The digital high-pass filter 4c then sends out such a band-by-band signal to the sound pressure regulating unit 5 and the digital band-pass filter 4b.

The digital band-pass filter 4b produces a band-by-band signal of the remaining mid-frequency range in which both the low- and high-frequency range components have been removed, by subtracting from the value of the discrete data the values of the corresponding band-by-band signals of the low- and high-frequency range. The digital band-pass filter 4b then sends out such a band-by-band signal to the sound pressure regulating unit 5.

The sound pressure regulating unit 5 is equipped with three amplifiers 5a, 5b and 5c corresponding to each of the low-frequency range, the mid-frequency range and the high-frequency range, respectively. An amplification coefficient for amplifying the sound pressure level of the band-by-band signal can be individually set with respect to each of the amplifier 5a, 5b and 5c by virtue of a sound pressure level regulating command from the setting unit 7.

Accordingly, in the sound pressure regulating unit 5, the amplifier 5a can amplify the band-by-band signal of the low-frequency range by multiplying only the band-by-band signal by a predetermined amplification coefficient. The amplifier 5b can amplify the band-by-band signal of the mid-frequency range by multiplying only the band-by-band signal by a predetermined amplification coefficient. The amplifier 5c can amplify the band-by-band signal of the high-frequency range by multiplying only the band-by-band signal by a predetermined amplification coefficient. Therefore, once the amplification coefficient has been set by a user having comparative difficulty in catching the low-frequency range so that only the sound pressure level of the band-by-band signal of the low-frequency range is amplified, the sound pressure regulating unit 5 produces a band-by-band regulated signal whose sound pressure has been amplified in accordance with the aforementioned amplification coefficient.

In this way, each of the amplifiers 5a, 5b, and 5c amplifies the sound pressure level of each band-by-band signal to a predetermined value based on the amplification coefficient acting as a predetermined sound pressure parameter individually set in advance, and individually sends out each band-by-band regulated signal thus produced to the interpolation processing unit 6. Here, the interpolation processing unit 6 is equipped with three band-by-band-by-band interpolation units 6a, 6b and 6c corresponding to each of the low-frequency range, the mid-frequency range and the high-frequency range, respectively. Further, a predetermined sampling function for performing interpolation on each band-by-band-by-band regulated signal can be individually set with respect to each band-by-band interpolation unit 6a, 6b and 6c by virtue of an interpolation processing selection command from the setting unit 7.

Accordingly, the band-by-band interpolation unit 6a performs interpolation only on the band-by-band regulated signal of the low-frequency range based on the sampling function set by the setting unit 7 in advance, and by interpolating a band-by-band-by-band data composing the band-by-band regulated signal, increases a sampling frequency in a pseudo manner to produce an interpolation processed signal. The band-by-band interpolation unit 6a then sends out the interpolation processed signal thus obtained to the band synthesizing unit 8. Further, at that time, the band-by-band interpolation unit 6b performs interpolation only on the band-by-band regulated signal of the mid-frequency range based on a sampling function set by the setting unit 7 independently from sampling functions provided for other band-by-band interpolation units 6a, 6c, and increases a sampling frequency in a pseudo manner to produce an interpolation processed signal by interpolating the band-by-band-by-band data composing the band-by-band regulated signal. The band-by-band interpolation unit 6b then sends out the interpolation processed signal thus obtained to the band synthesizing unit 8. In addition, at that time, the band-by-band interpolation unit 6c performs interpolation only on the band-by-band regulated signal of the high-frequency range based on a sampling function set by the setting unit 7 independently from those provided for other band-by-band interpolation units 6a, 6b, and by interpolating the band-by-band-by-band data composing the band-by-band regulated signal, increases a sampling frequency in a pseudo manner to produce an interpolation processed signal. The band-by-band interpolation unit 6c then sends out the interpolation processed signal thus obtained to the band synthesizing unit 8.

The band synthesizing unit 8 produces one analog signal having all frequency bands by synthesizing a plurality of the interpolation processed signals produced in each of the band-by-band interpolation units 6a, 6b and 6c, and sends out such an analog signal to an output unit 9. In this sense, since the interpolation processing unit 6 of the sound processing unit 3 individually performs interpolation with respect to each frequency band, different sampling function can be freely set with respect to each frequency band. Therefore, the sound processing unit 3 regulates an interpolation value for interpolating the band-by-band data with respect to each band-by-band regulated signal by appropriately modifying the sampling function, thereby enabling an interpolation processed signal regulated to be produced with respect to each frequency band, and thus making it possible to reproduce from the output unit 9 music having a sound quality desired by a user, in which the frequency characteristic of the analog signals has been finely regulated.

(2) Interpolation Process in the Band-by-Band Interpolation Unit

Next, the concept of the interpolation process carried out in each band-by-band interpolation unit 6a, 6b and 6c is described hereinafter. A sampling function $S_N(t)$ employed in the band-by-band interpolation unit 6a, 6b and 6c includes a fundamental sampling function $f(t)$ and a control sampling function $c_0(t)$. Here, when the sampling position of the discrete data is t, the sampling function $S_2(t)$ composed of the fundamental sampling function $f(t)$ and the control sampling function $c_0(t)$ is expressed by the following formula 15, between the sampling position [−2, 2] of the discrete data $$s_2(t) = f(t) + \alpha \cdot c_0(t) \quad \text{[Formula 15]}$$

where $c_0(t) = c_r(t) + c_r(-t)$

And, when a general control sampling function is $c_k(t)$ and when $c_k(t) = c_r(t-k) + c_r(-t-k)$, the sampling function $S_N(t)$ between the sampling positions [−N, N] of the aforementioned discrete data is expressed by the following formula.

$$S_N(t) = f(t) + \sum_{k=0}^{N-2} \alpha_k \cdot c_k(t) \quad \text{[Formula 16]}$$

Figure 16:
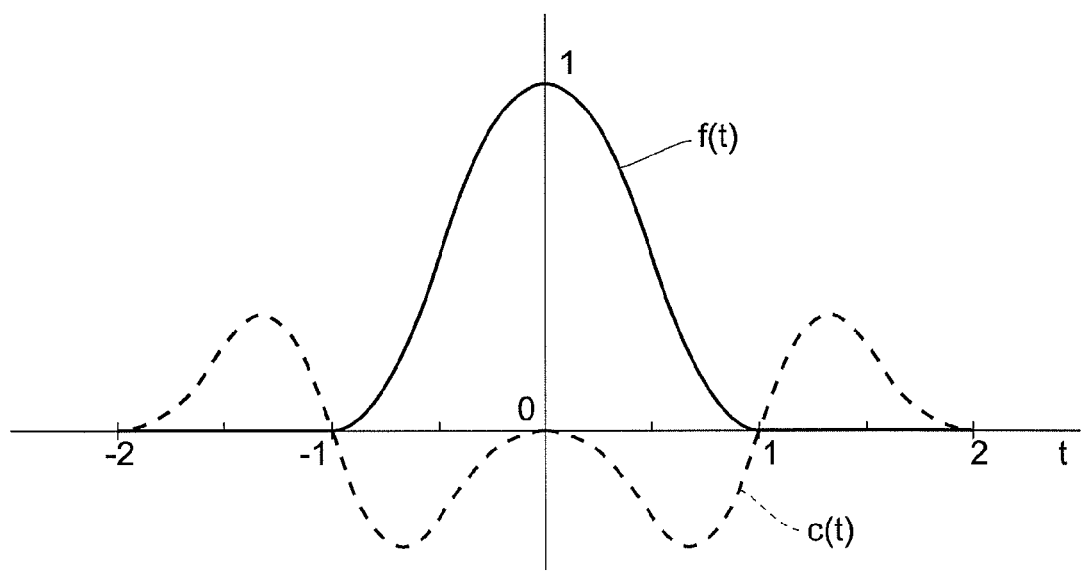
FIG. 16 is a schematic view illustrating a waveform of the fundamental sampling function and a waveform of the control sampling function, which are used in a band interpolation means according to the present invention.

However, $\alpha_k$ represents a variable parameter described later, and is an arbitrary value settable by a user. Further, $\alpha_k$ may also be an identical number which does not change in accordance with k, for example $\alpha_1 = \alpha_2 = \alpha_3 \ldots$ . Further, the sampling function $S_2(t)$ when N=2 is described below simply as the sampling function $S_N(t)$ for the sake of simplicity. With the use of the sampling function $S_N(t)$, an interpolation value reflecting the value of the variable parameter $\alpha$ can be calculated, thereby making it possible to regulate the interpolation processed signal with respect to each frequency band by changing the value of the variable parameter $\alpha$. The wave shapes of the fundamental sampling function $f(t)$ and the control sampling function $C_o(t)$ are shown in FIG. 16, and the amplitude of the wave shape of the control sampling function $C_o(t)$ may increase or decrease in accordance with the value of the variable parameter $\alpha$.

The fundamental sampling function $f(t)$ is expressed in the form of a piecewise polynomial function of finite support focusing on the differentiability thereof, and can be differentiated only once in the entire interval. Further, the fundamental sampling function $f(t)$ has a finite value other 0 when the sampling position t along the abscissa axis is between −1 and +1 (Namely, interval [−1, 1]), and invariably takes the value of 0 in the other intervals. Specifically, the representative functional form of the fundamental sampling function $f(t)$ is a second-order polynomial. The fundamental sampling function $f(t)$ has a convex wave shape differentiable only once in the entire interval, takes the value of 1 only at the sampling position t=0, converges toward 0 when proceeding to t=±1, and remains 0 until the sampling position becomes t=±2.

Further, this fundamental sampling function $f(t)$ may be an n-order impulse response function of finite support as long as it is an n-order piecewise polynomial function that is continuous in an interval defined by sampling points. Specifically, when such a fundamental sampling function $f(t)$ is a second-order piecewise polynomial function, it is expressed by the following formula 17.

$$f(t) = \begin{cases} 0 & t \in (-\infty, -1) \\ 2(t+1)^2 & t \in \left[-1, -\frac{1}{2}\right) \\ -2t^2 + 1 & t \in \left[-\frac{1}{2}, \frac{1}{2}\right) \\ 2(-t+1)^2 & t \in \left[\frac{1}{2}, 1\right) \\ 0 & t \in [1, \infty), \end{cases} \quad \text{[Formula 17]}$$

Furthermore, using this fundamental sampling function $f(t)$, superposition is carried out based on each band-by-band data composing the band-by-band regulated signal, thereby making it possible to temporarily interpolate the values between the band-by-band data of the band-by-band regulated signal with the function differentiable only once.

Meanwhile, the control sampling function $c_o(t)$ is expressed in the form of a piecewise polynomial function of finite support focusing on the differentiability thereof, and can be differentiated only once in the entire interval. Further, the control sampling function $c_o(t)$ has a finite value other 0 when the sampling position t along the abscissa axis is between −2 and +2 (Namely, an interval [−2, 2]), and invariably takes the value of 0 in the other intervals. Further, the control sampling function $c_o(t)$ has a wave shape differentiable only once in the entire interval, and takes the value of 0 at the sampling positions t=0, ±1 and ±2.

Further, this control sampling function $c_o(t)$ may be an n-order impulse response function of finite support as long as it is an n-order piecewise polynomial function that is continuous at an interval defined by sampling points. Here, the control sampling function $c_o(t)$ is expressed as a control sampling function $c_o(t)=c_r(t)+c_r(-t)$ as described above, and this $c_r(t)$ is specifically expressed by the following formula 18.

$$c_r(t) = \begin{cases} 0 & t \in (-\infty, 0) \\ -t^2 & t \in \left[0, \frac{1}{2}\right) \\ 3(-t+1)^2 - 2(-t+1) & t \in \left[\frac{1}{2}, 1\right) \\ -3(t-1)^2 + 2(t-1) & t \in \left[1, \frac{3}{2}\right) \\ (-t+2)^2 & t \in \left[\frac{3}{2}, 2\right) \\ 0 & t \in [2, \infty) \end{cases} \quad \text{[Formula 18]}$$

Furthermore, using this control sampling function $c_o(t)$, superposition is carried out based on each band-by-band data composing the band-by-band regulated signal, thereby making it possible to temporarily interpolate the value between the band-by-band data of the band-by-band regulated signal with the function differentiable only once.

The sampling function $S_N(t)$ is expressed as a linear combination of the fundamental sampling function f(t) and the control sampling function $C_o(t)$. An actual interpolation calculation is carried by linearly adding a temporary interpolation value (referred to as a fundamental interpolation value hereunder) obtained through the convolution operation of the fundamental sampling function f(t) and the discrete data (sampled value), and a temporary interpolation value (referred to as a control interpolation value hereunder) obtained through the convolution operation of the control sampling function $c_o(t)$ and the discrete data (sampled value), thereby making it possible to interpolate the value between the band-by-band data of the band-by-band regulated signal with the function differentiable only once.

In fact, the function expressed by the linear combination of the fundamental sampling function f(t) and the control sampling function $c_o(t)$ satisfies six conditions described below: first of all, $S_2(0)=1$, $S_2(\pm 1)=S_2(\pm 2)=0$; second, the function is an even function symmetric about the y-axis; third, the function invariably takes the value of 0 at the sampling position intervals [−∞, −2], [2, ∞]; fourth, the function is at most a second-order polynomial at each of intervals [n/2, (n+1)/2] (−4≤n≤3); fifth, the function is a class C1 function at the entire interval, and is therefore continuously differentiable only once; sixth, the function in the sampling position interval [−½, ½] is expressed by the following formula 19.

$$\sum_{k=-2}^{2} s_2(t-k) \equiv 1 \quad \text{[Formula 19]}$$

In addition, at that time, the control sampling function $c_o$ can be multiplied by the variable parameter α arbitrarily set by a user. In this way, with the control sampling function $c_o$ fixed as the value of 0 at sampling positions t=0, ±1, ±2, the amplitude of the wave shape of the control sampling function $c_o$ can vary between the sampling positions −2 and +2 in accordance with the value of the aforementioned variable parameter α. As a result, the control sampling function $c_o(t)$ can change the result of the convolution operation between itself and the discrete data (sample value). In this way, since the value of the variable parameter α can be changed, the frequency characteristic of the interpolation processed signal calculated by the sampling function $S_N(t)$ can also be changed, thereby making it possible to regulate the signal level of the high-frequency range components with respect to each frequency band.

Accordingly, the present invention regulates the interpolation processed signal with respect to each frequency band by changing the variable parameter α by which the control sampling function $c_o(t)$ is multiplied, and produces the analog signal by synthesizing a plurality of the interpolation processed signals produced in each frequency band, thereby making it possible to produce analog signals having the sound quality desired by the user, in which the high-frequency range has been finely regulated with respect to each frequency band.

(3) Circuit Configuration of the Band-by-Band Interpolation Unit (3-1) Overview of the Interpolation Process in the Band-by-Band Interpolation Unit The three band-by-band interpolation units 6a, 6b and 6c differ from each other in that the variable parameter α of the sampling function $S_N(t)$ for performing interpolation is individually set, and that the band-by-band regulated signals for performing the interpolation are different from each other. However, the band-by-band interpolation units 6a, 6b and 6c are identical to each other in the rest part of the configuration thereof. In this sense, explanation is made hereinafter focusing on the band-by-band interpolation unit 6a for interpolating the band-by-band regulated signal of the low-frequency range.

Figure 17:
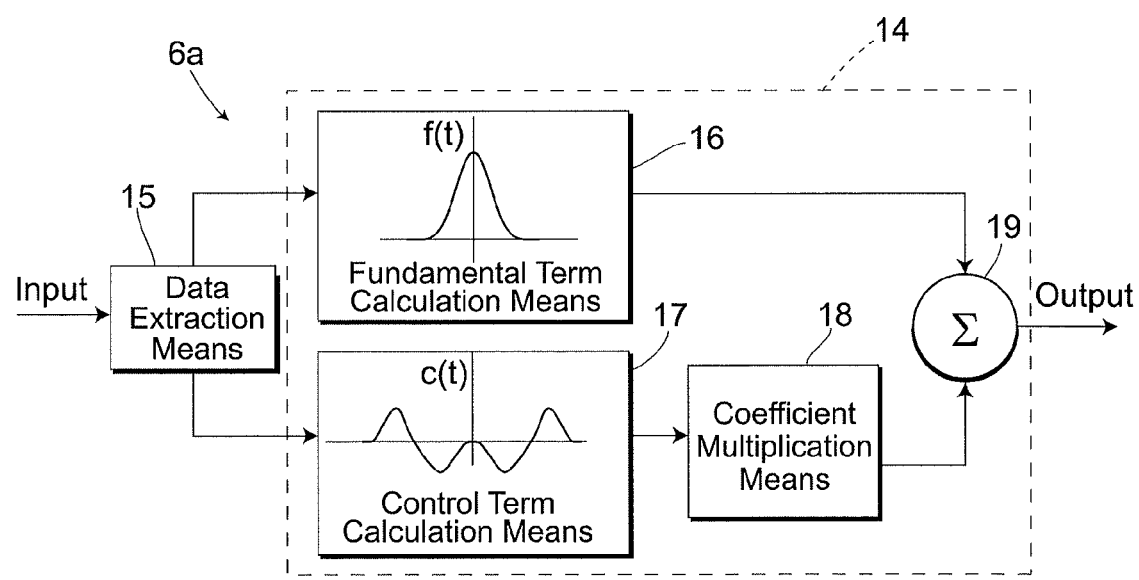
FIG. 17 is a block diagram illustrating a circuit configuration of the band interpolation means.

As shown in FIG. 17, the band-by-band interpolation unit 6a comprises: a data extraction means 15 for sequentially extracting and retaining a predetermined number (four in this case) of a band-by-band data composing the band-by-band regulated signal; and a function processing means 14 for receiving at one time a predetermined number of the band-by-band data which were extracted by the data extraction means 15 and were retained therein, and enabling interpolation using such band-by-band data. The band-by-band interpolation unit 6a can interpolate the band-by-band data sequentially inputted from the amplifier 5a at a predetermined time interval.

The function processing means 14 comprises a fundamental term calculation means 16 for processing the convolution operation of the terms of the fundamental sampling function f(t) among the sampling function $S_N(t)$, based on the band-by-band data; a control term calculation means 17 for processing the convolution operation of the terms of the control sampling function $c_o(t)$ among the sampling function $S_N(t)$, based on the band-by-band data; a coefficient multiplication means 18 for multiplying the result of the calculation completed by the control term calculation means 17 by the variable parameter α; and an adding means 19 for linearly adding the result of the calculation completed by the fundamental term calculation means 16 and the result of the calculation completed by the coefficient multiplication means 18.

In the case of this embodiment, the data extraction means 15 extracts the last four band-by-band data from the band-byband data inputted in series, retains these four band-by-band data until new band-by-band data has been inputted, and sends out the four band-by-band data to the fundamental term calculation means 16 and the control term calculation means 17

The fundamental term calculation means 16 stores the fundamental sampling function f(t) in a predetermined storage means (not shown), and calculates a value of the fundamental sampling function f(t) based on a distance between the interpolation position and the band-by-band data once the interpolation position between the band-by-band data has been specified. The fundamental term calculation means 16 can calculate the value of the fundamental sampling function f(t) individually with respect to each one of the four band-by-band data sent out by the data extraction means 15. Further, the fundamental term calculation means 16 multiplies the four values of the fundamental sampling function f(t) obtained with respect to each band-by-band data, by the corresponding values of the band-by-band data, followed by applying the convolution operation to the four band-by-band data and sending out the result of this convolution operation to the adding means 19.

At the same time, the control term calculation means 17 stores the control sampling function $c_o(t)$ in a predetermined storage means (not shown), and calculates a value of the control sampling function $c_o(t)$ based on a distance between the interpolation position and the band-by-band data once the interpolation position has been specified. The control term calculation means 17 can individually calculate the value of the control sampling function $c_o(t)$ with respect to each one of the four band-by-band data sent out by the data extraction means 15. Further, the control term calculation means 17 multiplies the four values of the control sampling function $c_o(t)$ obtained with respect to each band-by-band data, by the corresponding values of the band-by-band data, followed by applying the convolution operation to the four band-by-band data and sending out the result of this convolution operation to the coefficient multiplication means 18.

The coefficient multiplication means 18 multiplies the result of the convolution operation of the control sampling function $c_o(t)$, which has received from the control term calculation means 17, by the variable parameter α, and sends out to the adding means 19 the result of the multiplication by the variable parameter. The adding means 19 obtains calculation results corresponding to the four band-by-band data by linearly adding the result of the convolution operation of the fundamental sampling function f(t) received from the fundamental term calculation means 16 and the result of the multiplication by the variable parameter received from the coefficient multiplication means 18. The value obtained through the linear adding becomes the interpolation value of an interpolation position between the predetermined two band-by-band data. In fact, the value of the interpolation position is renewed with respect to a predetermined time interval set in advance, specifically with respect to a value obtained by multiplying a period T by 1/N (=T/N) corresponding to an input interval of the band-by-band data.

Figure 18:
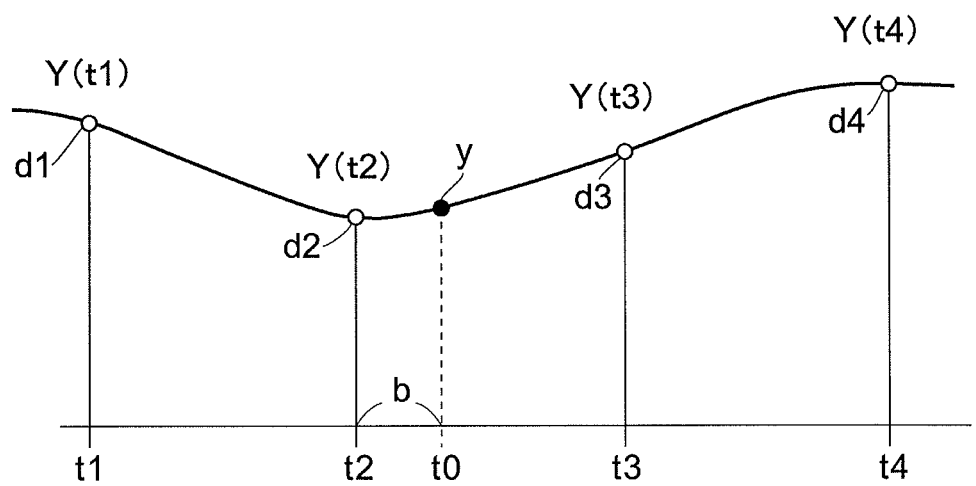
FIG. 18 is a schematic view illustrating a positional relationship between four band-by-band data and a marked point.

(3-2) Specific Example for Obtaining the Interpolation Value Based on the Four Band-by-Band Data Next, an explanation is performed hereunder about the interpolation process for calculating the interpolation value between the predetermined two band-by-band data based on the temporally-ordered four band-by-band data, using FIG. 18 showing the positional relationship between the consecutive four band-by-band data and the interpolation position which is the marked point. FIG. 18 shows that each of the values of the band-by-band data d1, d2, d3, d4 sequentially inputted with respect to the sampling positions t1, t2, t3, t4 are represented by Y(t1), Y(t2), Y(t3), Y(t4), respectively, thus describing a case in which an interpolation value y corresponding to a predetermined position t0 (namely, interpolation position (a distance b from t2)) between a sampling positions t2 and t3 is obtained.

Since the sampling function $S_N(t)$ employed in the present embodiment converges toward 0 at the sampling position of t=±2, the band-by-band data d1, d2, d3, d4 within t=±2 may be considered. Accordingly, when obtaining the interpolation value y shown in FIG. 18, only the four band-by-band data d1, d2, d3, d4 corresponding to t=t1, t2, t3, t4, respectively may be considered, thus drastically reducing the calculation amount. In fact, respective band-by-band data (not shown) at t=±3 or more should essentially be considered. But, such band-by-band data are disregarded here not because the calculation amount and accuracy or the like is considered, but because, theoretically, such band-by-band data do not need to be considered, and truncation errors do not occur.

Figure 19:
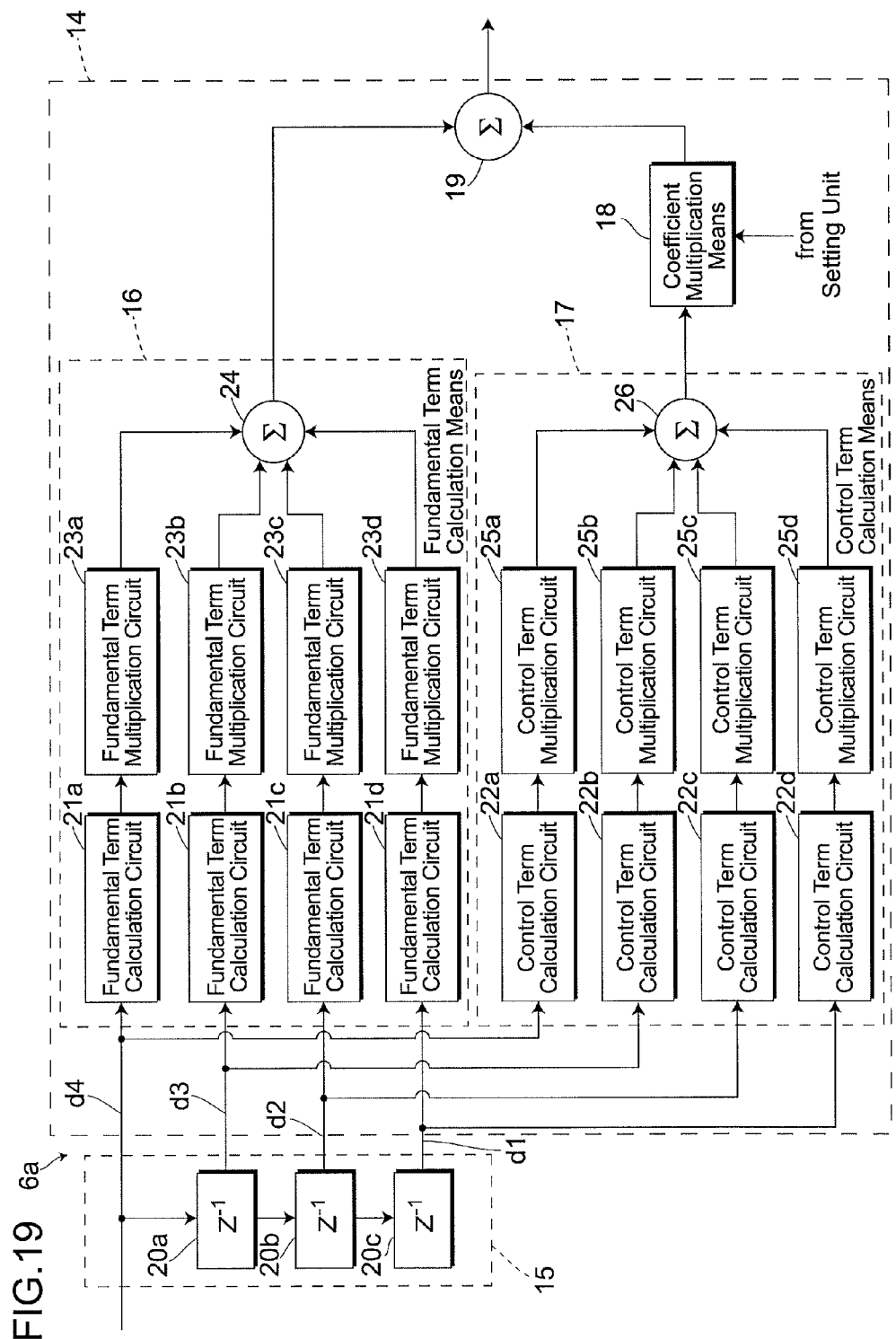
FIG. 19 is a block diagram illustrating a detailed configuration of the band interpolation means.

As shown in FIG. 19, the data extraction means 15 comprises three shift circuits 20a, 20b, and 20c. Once the consecutive band-by-band data have been inputted, the data extraction means 15 shifts the band-by-band data in each shift circuit 20a, 20b, and 20c at, for example, a sampling period of CD (44.1 kHz). The data extraction means 15 can extract and retain the last band-by-band data d1, d2, d3, and d4 one by one in each shift circuit 20a, 20b and 20c. Namely, once the four consecutive band-by-band data d1, d2, d3 and d4 have been inputted, the data extraction means 15 sends out the last band-by-band data d4 directly to a fundamental term calculation circuit 21a of the fundamental term calculation means 16 and a control term calculation circuit 22a of the control term calculation means 17.

Further, the data extraction means 15 sends out to the shift circuit 20a a band-by-band data sequence consisting of the four consecutive band-by-band data d1, d2, d3 and d4, and extracts the band-by-band data d3 which is the second last band-by-band data in relation to the last band-by-band data d4 after shifting the band-by-band data sequence by means of the shift circuit 20b. The data extraction means 15 then sends out the band-by-band data d3 to a fundamental term calculation circuit 21b of the fundamental term calculation means 16 and a control term calculation circuit 22b of the control term calculation means 17.

Furthermore, the data extraction means 15 sequentially sends out the band-by-band data sequence to the other shift circuits 20b, 20c also, and sends out the band-by-band data d2, which is the third last band-by-band data in relation to the last band-by-band data d4, to a fundamental term calculation circuit 21c and a control term calculation circuit 22c after further shifting the band-by-band data sequence in the shift circuit 20b. The data extraction means 15 further sends out the band-by-band data d1, which is the fourth last band-by-band data in relation to the last band-by-band data d4, to a fundamental term calculation circuit 21d and a control term calculation circuit 22d after further shifting the band-by-band data sequence in the shift circuit 20c.

Figure 20:
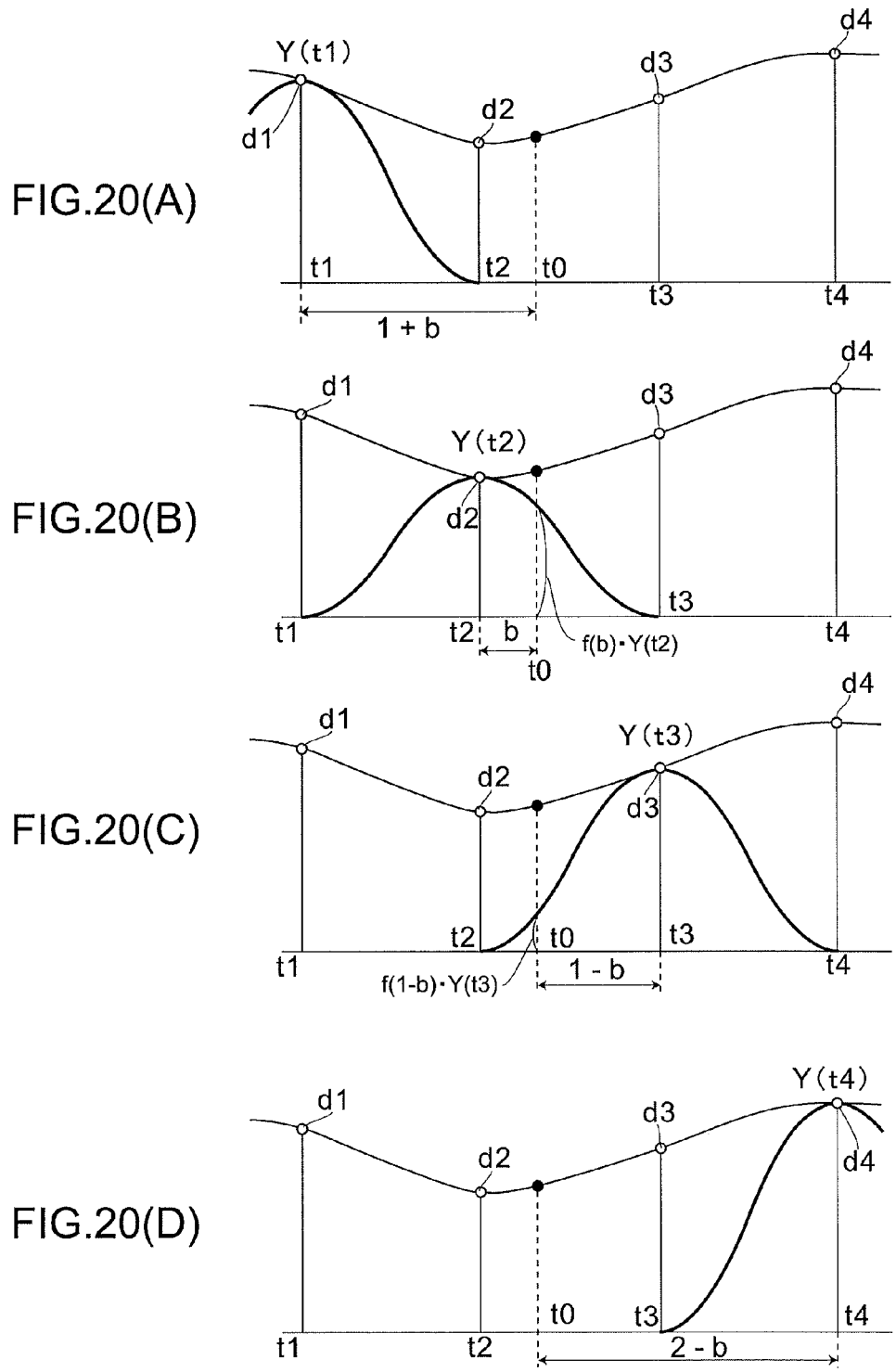
FIG. 20 is a schematic view illustrating an interpolation process using the fundamental sampling function, which is performed by the band interpolation means according to the present invention.
Figure 21:
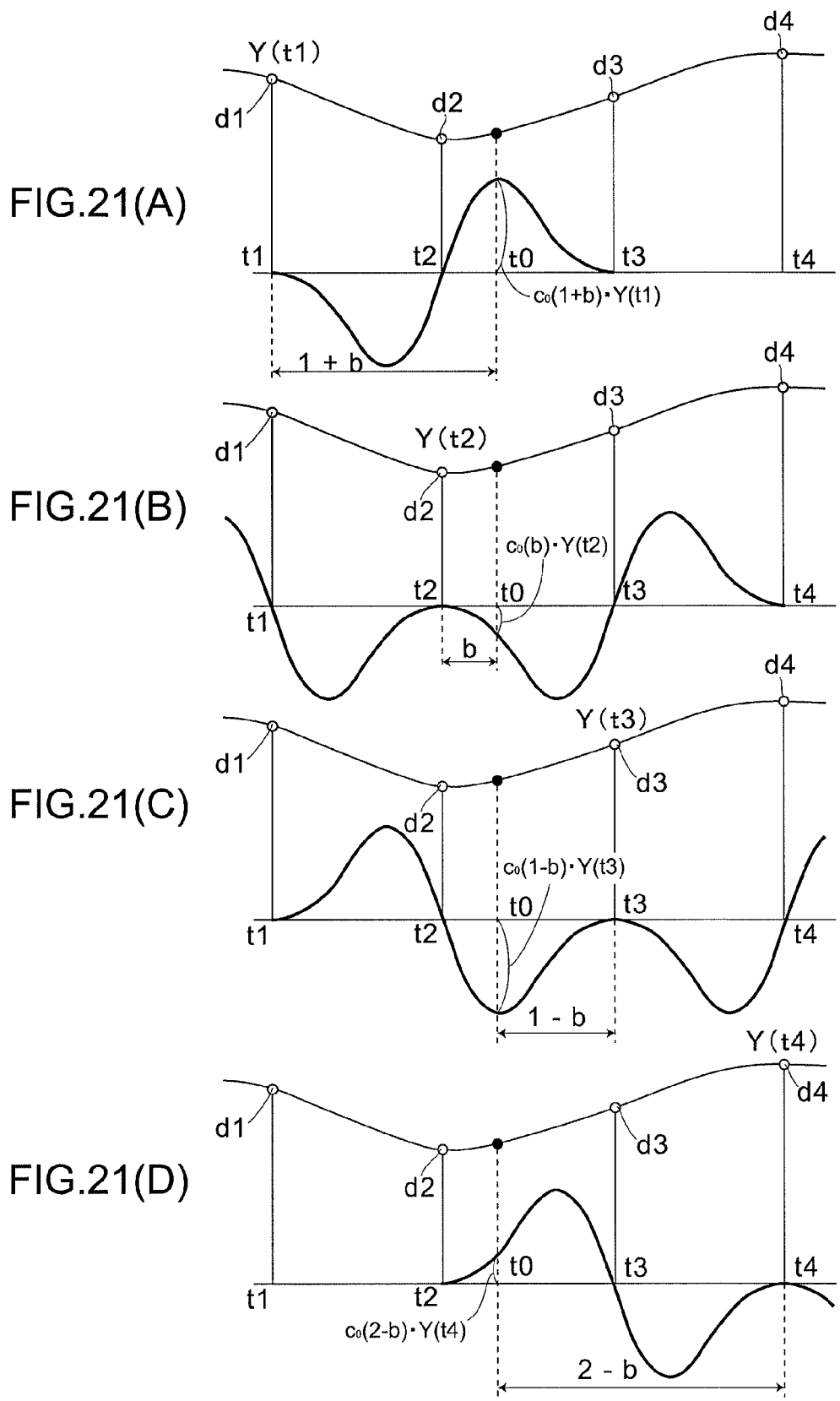
FIG. 21 is a schematic view illustrating an interpolation process using the control sampling function, which is performed by the band interpolation value unit according to the present invention.
Figure 22:
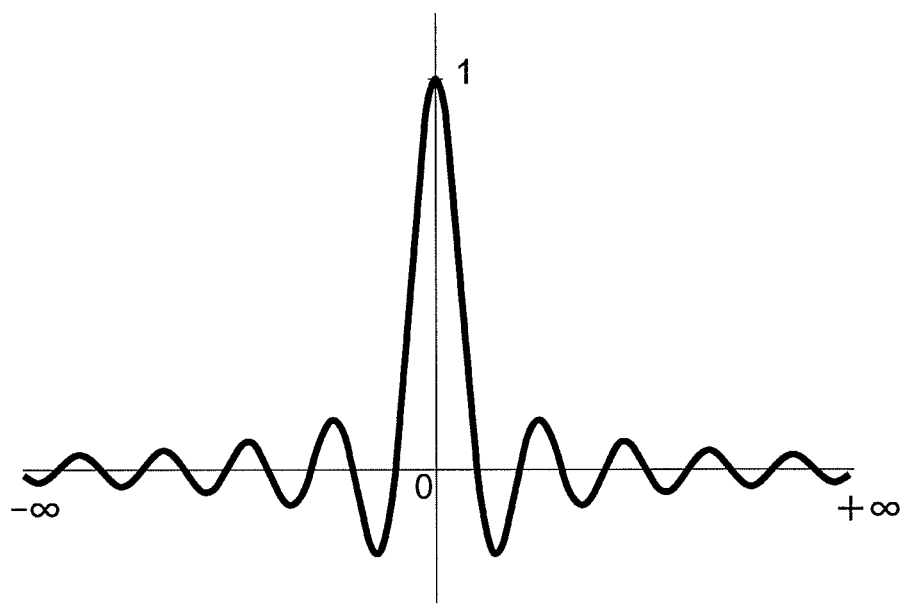
FIG. 22 is a schematic view illustrating a waveform of a traditional sampling function according to Shannon.

Here, FIG. 7 and FIG. 8 are the diagrams showing the concept of the interpolation process regarding the predetermined interpolation position t0 in the fundamental term calculation means 16 and the control term calculation means 17 of the present embodiment. With regard to the content of the interpolation process, two calculation processes are carried out in the beginning as described above. One of them is a calculation process for calculating a fundamental interpolation value in the fundamental term calculation means 16 (simply referred to as fundamental interpolation value calculation process, hereunder), and the other is a calculation process for calculating a control interpolation value in the control term calculation means 17 and the coefficient multiplication means 18 (simply referred to as control interpolation value calculation process, hereunder). Explanation is performed hereunder about the fundamental interpolation value calculation process and the control interpolation value calculation process, using FIG. 20 and FIG. 21.

(3-2-1) Fundamental Interpolation Value Calculation Process

With regard to the content of the fundamental interpolation value calculation process, as shown in FIGS. 20(A) to (D), the peak height of the fundamental sampling function f(t) when t=0 (a center position) is shifted with respect to each of the sampling positions t1, t2, t3, and t4, and the value of each fundamental sampling function f(t) at the interpolation position t0 at that time is obtained.

When focusing on the band-by-band data d1 at the sampling position t1 in FIG. 20(A), the distance between the interpolation position t0 and the sampling position t1 is 1+b. Accordingly, the value of the fundamental sampling function f(t) is f(1+b) at the interpolation position t0 when the center position of the fundamental sampling function f(t) is located at the sampling position t1. In fact, since the peak height of the center position of the fundamental sampling function f(t) is allowed to become identical with the value Y(t1) of the band-by-band data d1, a value f(1+b)·Y(t1) obtained by multiplying the aforementioned f(1+b) by Y(t1) is the value to be obtained. The calculation of f(1+b) is carried out in the fundamental term calculation circuit 21a of the fundamental term calculation means 16, and the calculation in which f(1+b) is multiplied by Y(t1) is carried out in a fundamental term multiplication circuit 23a of the fundamental term calculation means 16 (FIG. 19).

Similarly, when focusing on the value Y(t2) of the band-by-band data d2 at the sampling position t2 in FIG. 20(B), the distance between the interpolation position t0 and the sampling position t2 is b. Accordingly, the value of the fundamental sampling function f(t) is f(b) at the interpolation position t0 when the center position of the fundamental sampling function f(t) is located at the sampling position t2. In fact, since the peak height of the center position of the fundamental sampling function f(t) is allowed to become identical with the value Y(t2) of the band-by-band data d2, a value f(b)·Y(t2) obtained by multiplying the aforementioned f(b) by Y(t2) is the value to be obtained. The calculation of f(b) is carried out in the fundamental term calculation circuit 21b of the fundamental term calculation means 16, and the calculation in which f(b) is multiplied by Y(t2) is carried out in a fundamental term multiplication circuit 23b of the fundamental term calculation means 16 (FIG. 19).

When focusing on the value Y(t3) of the band-by-band data d3 at the sampling position t3 in FIG. 20(C), the distance between the interpolation position t0 and the sampling position t3 is 1−b. Accordingly, the value of the fundamental sampling function f(t) is f(1−b) at the interpolation position t0 when the center position of the fundamental sampling function f(t) is located at the sampling position t3. In fact, since the peak height of the center position of the fundamental sampling function f(t) is allowed to become identical with the value Y(t3) of the band-by-band data, a value f(1−b)·Y(t3) obtained by multiplying the aforementioned f(1−b) by Y(t3) is the value to be obtained. The calculation of f(1−b) is carried out in the fundamental term calculation circuit 21c of the fundamental term calculation means 16, and the calculation in which f(1−b) is multiplied by Y(t3) is carried out in a fundamental term multiplication circuit 23c of the fundamental term calculation means 16 (FIG. 19).

When focusing on the value Y(t4) of the band-by-band data d4 at the sampling position t4 in FIG. 20(D), the distance between the interpolation position t0 and the sampling position t4 is 2−b. Accordingly, the value of the fundamental sampling function f(t) is f(2−b) at the interpolation position t0 when the center position of the fundamental sampling function f(t) is located at the sampling position t4. In fact, since the peak height of the center position of the fundamental sampling function f(2−b) is allowed to become identical with the value Y(t4) of the band-by-band data d4, a value f(2−b)·Y(t4) obtained by multiplying the aforementioned f(2−b) by Y(t4) is the value to be obtained. The calculation of f(2−b) is carried out in the fundamental term calculation circuit 21d of the fundamental term calculation means 16, and the calculation in which f(2−b) is multiplied by Y(t4) is carried out in a fundamental term multiplication circuit 23d of the fundamental term calculation means 16 (FIG. 19).

In addition, the fundamental term calculation means 16 applies the convolution operation of the four values, f(1+b)·Y(t1), f(b)·Y(t2), f(1−b)·Y(t3), f(2−b)·Y(t4) obtained with respect to the marked points of the interpolation position t0, in a fundamental term convolution circuit 24, and a fundamental interpolation value ya is calculated in the low-frequency range. In fact, in the case of this embodiment, since the values f(1+b)·Y(t1) and f(2−b)·Y(t4) obtained with respect to the marked points of the interpolation position t0 are 0 as shown in FIGS. 20(A) and (D), the fundamental interpolation value ya becomes {f(b)·Y(t2)}+{f(1−b)·Y(t3)}.

(3-2-2) Control Interpolation Value Calculation Process

Meanwhile, with regard to the content of the control interpolation value calculation process, as shown in FIGS. 21(A) to (D), the control sampling function $c_o(t)$ when t=0 (a center position) is allowed to become identical with each of the sampling positions t1, t2, t3, and t4, and is multiplied by the values, Y(t1), Y(t2), Y(t3), Y(t4) of the band-by-band data d1, d2, d3, d4 corresponding to each control sampling function $c_o(t)$. The value of each control sampling function $c_o(t)$ at the interpolation position t0 at that time is to be obtained.

When focusing on the value Y(t1) of the band-by-band data d1 at the sampling position t1 in FIG. 21(A), the distance between the interpolation position t0 and the sampling position t1 is 1+b. Accordingly, the value of the control sampling function $c_o(t)$ is $c_o(1+b)$ at the interpolation position t0 when the center position of the control sampling function $c_o(t)$ is located at the sampling position t1. In fact, since the height of the wave shape of the control sampling function $c_o(t)$ is allowed to become identical with the value Y(t1) of the band-by-band data d1, a value $c_o(1+b)$·Y(t1) obtained by multiplying the aforementioned $c_o(1+b)$ by Y(t1) is the value to be obtained. The calculation of $c_o(1+b)$ is carried out in the control term calculation circuit 22a of the control term calculation means 17, and the calculation in which $c_o(1+b)$ is multiplied with Y(t1) is carried out in a control term multiplication circuit 25a of the control term calculation means 17 (FIG. 19).

Similarly, when focusing on the value Y(t2) of the band-by-band data d2 at the sampling position t2 in FIG. 21(B), the distance between the interpolation position t0 and the sampling position t2 is b. Accordingly, the value of the control sampling function $c_o(t)$ is $c_o(b)$ at the interpolation position t0 when the center position of the control sampling function $c_o(t)$ is located at the sampling position t2. In fact, since the height of the wave shape of the control sampling function $c_o(t)$ is allowed to become identical with the value Y(t2) of the band-by-band data d2, a value $c_o(b)$·Y(t2) obtained by multiplying the aforementioned $c_o(b)$ by Y(t2) is the value to be obtained. The calculation of $c_o(b)$ is carried out in the control term calculation circuit 22b of the control term calculation means 17, and the calculation in which $c_o(b)$ is multiplied with Y(t2) is carried out in a control term multiplication circuit 25b of the control term calculation means 17 (FIG. 19).

When focusing on the value Y(t3) of the band-by-band data d3 at the sampling position t3 in FIG. 21(C), the distance between the interpolation position t0 and the sampling position t3 is 1−b. Accordingly, the value of the control sampling function $c_o(t)$ is $c_o(1-b)$ at the interpolation position t0 when the center position of the control sampling function $c_o(t)$ is located at the sampling position t3. In fact, since the height of the wave shape of the control sampling function $c_o(t)$ is allowed to become identical with the value Y(t3) of the band-by-band data d3, a value $c_o(1-b) \cdot Y(t3)$ obtained by multiplying the aforementioned $c_o(1-b)$ by Y(t3) is the value to be obtained. The calculation of $c_o(1-b)$ is carried out in the control term calculation circuit 22c of the control term calculation means 17, and the calculation in which $c_o(1-b)$ is multiplied with Y(t3) is carried out in a control term multiplication circuit 25c of the control term calculation means 17 (FIG. 19).

When focusing on the value Y(t4) of the band-by-band data d4 at the sampling position t4 in FIG. 21(D), the distance between the interpolation position t0 and the sampling position t4 is 2−b. Accordingly, the value of the control sampling function $c_o(t)$ is $c_o(2-b)$ at the interpolation position t0 when the center position of the control sampling function $c_o(t)$ is located at the sampling position t4. In fact, since the height of the wave shape of the control sampling function $c_o(2-b)$ is allowed to become identical with the value Y(t4) of the band-by-band data d4, a value $c_o(2-b) \cdot Y(t4)$ obtained by multiplying the aforementioned $c_o(2-b)$ by Y(t4) is the value to be obtained. The calculation of $c_o(2-b)$ is carried out in the control term calculation circuit 22d of the control term calculation means 17, and the calculation in which $c_o(2-b)$ is multiplied with Y(t4) is carried out in a control term multiplication circuit 25d of the control term calculation means 17 (FIG. 19).

In addition, a control term convolution operation circuit 26 of the control term calculation means 17 performs convolution operations of the four values, $c_o(1+b) \cdot Y(t1)$, $c_o(b) \cdot Y(t2)$, $c_o(1-b) \cdot Y(t3)$, $c_o(2-b) \cdot Y(t4)$ obtained with respect to the marked points of the interpolation position t0. The result thus obtained is further multiplied with the variable parameter α in the coefficient multiplication means 18. In this way, a control interpolation value yb in the frequency band of the low-frequency range is calculated.

(3-2-3) Interpolation Value Calculation Process

The adding means 19 can output an interpolation value y of the interpolation position t0 in the low-frequency range by linearly adding the fundamental interpolation value ya, which is calculated by the fundamental term calculation means 16 and corresponds to the marked point, and the control interpolation value yb, which is calculated by the control term calculation means 17 and the coefficient multiplication means 18 and corresponds to the marked points. In this way, the interpolation values of all the other interpolation positions between the band-by-band data d2 and d3 are calculated in the same way, and the same method for processing interpolation can be carried out also in the band-by-band interpolation unit 6b, 6c, using sampling functions set with respect to the mid-frequency range and the high-frequency range.

(3-3) Result of the Interpolation Process when the Value of the Variable Parameter has Been Changed In addition to such configuration, in the sound processing unit 3, the value of the variable parameter α of the coefficient multiplication means 18 is changed with respect to each band-by-band interpolation unit 6a, 6b, and 6c via the setting unit 7, thereby allowing the values of the sampling function $S_N(t)$ to be changed with respect to each band-by-band interpolation unit 6a, 6b and 6c, thus making it possible to regulate the interpolation value y with respect to each frequency band. As a result, the frequency characteristics of the analog signal produced in the band synthesizing unit 8 can be regulated by changing the value of the variable parameter α with respect to each frequency band. Here, explanation is made hereunder about how the sampling function $S_N(t)$ changes when the variable parameter α has been changed, while focusing on the wave shape combining the wave shape of the fundamental sampling function f(t) with the wave shape of the control sampling function $c_o(t)$ as shown in FIG. 16

As shown in FIG. 8 of the first embodiment described above, the wave shape of the sampling function $S_N(t)$ combining the wave shape of the fundamental sampling function f(t) with the wave shape of the control sampling function $c_o(t)$ drastically varies in accordance with the value of the variable parameter α. Here, a wave shape having the characteristics as shown in FIG. 9 described in the aforementioned first embodiment is produced in a similar way even when the band-by-band data produced by separating the discrete data into the frequency bands of the low-frequency range, the mid-frequency range and the high-frequency range have been interpolated, thereby making it possible to reproduce the high-frequency range component within each range of the low frequency, the mid-frequency and the high frequency, as compared to the conventional case in which Shannon's sampling function is used.

Further, as shown in FIG. 9, when the variable parameter α was set to 1.5, −1.5, or −0.25, the wave shape of each signal level was found to be different from each other. But, a wave shape having such characteristics is produced in a similar way even when the band-by-band data produced by separating the discrete data into the frequency bands of the low-frequency range, the mid-frequency range and the high-frequency range have been interpolated. Accordingly, in the second embodiment, the signal level within each frequency band of the low-frequency range, the mid-frequency range and the high-frequency range can be regulated individually by appropriately changing the value of the variable parameter α with respect to each frequency band of the low-frequency range, the mid-frequency range and the high-frequency range.

In this sense, the sound processing unit 3 can finely regulate the signal level with respect to each frequency band by changing the variable parameter α of the sampling function $S_N(t)$ with respect to each frequency band, thereby allowing the user to further finely regulate the frequency characteristics with ease. In this way, in the present invention, each interpolation processed signal is individually regulated by changing the variable parameter α with respect to each frequency band. An analog signal is then produced by synthesizing a plurality of the interpolation processed signals regulated in a manner as described earlier, thereby making it possible to produce an analog signal whose high-frequency range has been finely regulated with respect to each frequency band.

(4) Calculation and Effect

With regard to the aforementioned configuration, in the sound processing unit 3, the discrete data are separated into each frequency band of the low-frequency range, the mid-frequency range and the high-frequency range. Further, the band-by-band interpolation units 6a, 6b and 6c are provided with respect to a plurality of the band-by-band regulated signals produced in each frequency band, thereby making it possible to individually interpolate the band-by-band regulated signal via each band-by-band interpolation unit 6a, 6b and 6c. In this way, in the sound processing unit 3, the sampling function used for performing interpolation with respect to each frequency band can be changed. And, by changing such sampling function with respect to each frequency band, the interpolation processed signal obtained through interpolation can be finely regulated with respect to each frequency band. Therefore, by synthesizing a plurality of the interpolation processed signals obtained through such interpolation, the frequency characteristics of the analog signal can be finely changed as necessary, thereby making it possible to reproduce music with a high sound quality desired by the user.

In this sense, in the sound processing unit 3, the interpolation processed signal whose interpolation value has been finely regulated with respect to each frequency band is produced. And, an analog signal is further produced by synthesizing such a plurality of the interpolation processed signals. Therefore, by allowing the user to appropriately change the sampling function with respect to each frequency band and in accordance with various conditions including reproduction environment, sound source, music tones and so on, it becomes possible to reproduce music with a high quality desired by the user, in which the frequency characteristics of the analog signal have been regulated.

Specifically, in the present invention, since the variable parameter $\alpha$ of the sampling function $S_N(t)$ can be individually changed with respect to each frequency band to perform interpolation, the interpolation value can be finely regulated with respect to each frequency band, thereby making it possible to further finely regulate the frequency characteristics of the analog signal. Namely, as compared to the case in which the frequency characteristics are regulated by simply changing the variable parameter $\alpha$ of the sampling function $S_N(t)$ so as to interpolate the discrete data of all frequency bands without separating such discrete data into each frequency band of the low, the intermediate and the high-frequency range, the present invention allows the interpolation value to be finely regulated with respect to each frequency band, thereby making it possible to further finely regulate the frequency characteristics of the analog signal and reproduce music with a high quality desired by the user.

Further, in the case of this embodiment, the fundamental sampling function f(t) is stored in the fundamental term calculation means 16 in advance, followed by calculating the value of the fundamental sampling function f(t) while t represents the distance to the interpolation position t0 from each band-by-band data d1, d2, d3 and d4 extracted by the data extraction means 15, and then applying convolution operation to the value of the fundamental sampling function f(t) corresponding to each band-by-band data d1, d2, d3 and d4. In this way, the fundamental interpolation value ya at the interpolation position t0 is calculated.

Furthermore, in the sound processing unit 3, the control sampling function $C_o(t)$ is stored in the control term calculation means 17 in advance, followed by calculating the value of the control sampling function $c_o(t)$ while t represents the distance to the interpolation position t0 from each band-by-band data d1, d2, d3 and d4 extracted by the data extraction means 15, and then applying convolution operation to the value of the control sampling function $c_o(t)$ corresponding to each band-by-band data d1, d2, d3 and d4. In addition, the result of the convolution operation of the control sampling function $c_o(t)$ is multiplied with the variable parameter $\alpha$ of an arbitrary number set by a user, thereby obtaining the control interpolation value yb at the interpolation position t0.

Also, in the sound processing unit 3, the fundamental interpolation value ya and the control interpolation value yb thus obtained are linearly added together so as to calculate the interpolation value y between the discrete data, thereby making it possible to obtain an interpolation value y reflecting the value of the variable parameter $\alpha$ with which the value of the control sampling function $C_o(t)$ is multiplied.

Accordingly, in the sound processing unit 3, the interpolation value y obtained through the interpolation process by the sampling function $S_N(t)$ can be easily regulated by simply changing the value of the variable parameter $\alpha$, thereby eliminating the necessity of providing a plurality of circuit boards with respect to each different sampling function $S_N(t)$, and thus simplifying the configuration and reducing the cost.

Further, in the sound processing unit 3, the fundamental sampling function f(t) and the control sampling function $c_o(t)$, both of which are of finite support and can be differentiated for only once in the entire interval, are employed as the sampling function $S_N(t)$, and the control sampling function $c_o(t)$ is multiplied with the variable parameter $\alpha$, thereby making it possible to drastically reduce the calculation amount needed for interpolating the discrete data as compared to the conventional case in which Shannon's sampling function is used, and prevent aliasing distortion since truncation errors as observed in the case in which Shannon's sampling function is used do not occur.

In the case of this embodiment, the value of the wave shape of the sampling function $S_N(t)$ is allowed to converge toward 0 in an interval defined by a set of two interpolation positions located before and after the interpolation position t0 or a narrower interval. Therefore, only four discrete data including the two discrete data located before and after the focal position are used when performing data interpolation and the like using the sampling function $S_N(t)$, thereby drastically reducing a processing burden as compared to the case in which Shannon's sampling function is used.

Further, in the case of this embodiment, with regard to the sampling function $S_N(t)$, the fundamental sampling function f(t) and the control sampling function $C_o(t)$ which varies due to the value of the variable parameter $\alpha$ are stored independently from each other, and individually apply convolution operation to the discrete data. The result of the convolution operation of the control sampling function $C_o(t)$ and the discrete data is multiplied with the variable parameter $\alpha$, and the result of the convolution operation of the fundamental sampling function $S_N(t)$ and the discrete data is linearly added to the result thus obtained. In this way, an output signal is obtained, and because of such configuration, only one control sampling function $C_o(t)$ is needed, thereby simplifying the formulas as much as possible and allowing the variable control of the control sampling function $C_o(t)$ to be carried out easily.

In addition, in the sound processing unit 3, the amplifier 5a, 5b and 5c is provided with respect to each frequency band and the sound pressure level is individually amplified by each amplifier 5a, 5b and 5c, thereby allowing the user to choose to amplify only the sound pressure level of the frequency band he/she finds difficult to catch as necessary, and thus making it possible to reproduce music with a high quality desired by the user.

(5) Other Embodiments

However, the present invention is not limited to the present embodiment, and various modifications can be made without departing from its inventive spirit. For example, although the sampling function $S_N(t)$ is a piece wise polynomial function of finite support, which can be differentiated for only once in the entire interval, the number of times the function can be differentiated may be set to two or more. Further, in the aforementioned embodiment, explanation was made about the configuration in which the analog signal is produced as a synthesized signal by performing interpolation using the sampling function $S_N(t)$. However, the present invention is not limited to such configuration, and may employ a configuration in which a synthesized signal which has been simply oversampled is produced by performing interpolation using the sampling function $S_N(t)$, followed by producing the analog signal by means of an analog-digital converter.

Further, in the aforementioned embodiment, explanation was made about the case in which the sampling function $S_N(t)$ converges toward 0 when $t=\pm 2$. However, the present invention is not limited to such case, and the sampling function $S_N(t)$ can be rendered to converge toward 0 when $t=\pm 3$ or more. For example, when the sampling function $S_N(t)$ converges toward 0 when $t=\pm 3$, the last six discrete data are extracted by the data extraction means 15, and the values of the sampling function $S_N(t)$ are calculated with respect to these six discrete data by means of the function processing means 14.

Furthermore, in the aforementioned embodiment, the fundamental sampling function f(t) and the control sampling function $C_o(t)$ are stored in the fundamental term calculation means 16 and the control term calculation means 17 respectively. The fundamental interpolation value ya and the control interpolation value yb are then calculated by applying convolution operation to the band-by-band data d1, d2, d3 and d4 using the fundamental sampling function f(t) and the control sampling function $c_o(t)$ respectively, followed by linearly adding the fundamental interpolation value ya and the control interpolation value yb so as to obtain the interpolation value y. However, the present invention is not limited to such configuration. The sampling function $S_N(t)$ can be obtained by linearly adding the fundamental sampling function f(t) and the control sampling function $c_o(t)$ in advance, and stored. In this case, using the sampling function $S_N(t)$ whose variable parameter α has been changed, convolution operation of the band-by-band data d1, d2, d3 and d4 can be applied so as to directly calculate the interpolation value y.

Furthermore, in the aforementioned embodiment, explanation was made about the case in which the interpolation process is carried out with respect to the band-by-band regulated signal whose sound pressure level has been amplified. However, the present invention is not limited to such case. The predetermined interpolation process can also be carried out with respect to each band-by-band signal by rendering an interpolation process unit to directly receive a band-by-band signal separated by the band separation means into the predetermined frequency bands, without amplifying the sound pressure with respect to each frequency band.

Furthermore, in the aforementioned embodiment, explanation was made about the case in which the interpolation process is carried out after the sound pressure has been amplified. However, the present invention is not limited to such configuration. As a matter of fact, the sound pressure level can be amplified after the interpolation process has been carried out. In this case, the interpolation process is individually carried out with respect to the band-by-band regulated signal, and the interpolation processed signals thus obtained is then individually multiplied with the sound pressure parameter.

Furthermore, in the aforementioned embodiment, the explanation was made about the case in which the sound pressure level of the frequency band a user finds difficult to catch is amplified by multiplying the amplification coefficient acting as the sound pressure parameter. However, the present invention is not limited to such a configuration. As a matter of fact, the sound pressure level of the frequency band a user finds easy to catch can be attenuated by multiplying an attenuation value acting as the sound pressure parameter. Even in this case, other frequency bands whose sound pressure levels have not been attenuated can also be emphasized, thereby making it easy for a user to catch the frequency band he/she usually finds difficult to catch, thus making it possible to reproduce a music with a high quality desired by the user.

Furthermore, in the aforementioned embodiment, explanation was made about the case in which the discrete data is separated into three frequency bands of the low-frequency range, the mid-frequency range and the high-frequency range. However, the present invention is not limited to such configuration. The discrete data can be separated into the two frequency bands of the low-frequency range and high-frequency range, or even into a plurality of the frequency bands of four or five including a low mid-frequency range etc. between the low-frequency range and the high-frequency range. In this case, the amplifiers and the band-by-band interpolation units can be provided in accordance with the number of the frequency bands for separation.

The invention claimed is:

1. A sound processing apparatus installed in an audio apparatus and having a circuit configuration configured to interpolate positions among a plurality of temporally-ordered discrete data input in series at given time intervals, the sound processing apparatus comprising:

a discrete data extraction unit configured to extract said discrete data in series to hold; and a function processing unit configured to receive at a time a given number of said discrete data extracted to be held by said discrete data extraction unit and to perform an interpolation process using said discrete data, wherein said function processing unit is configured to calculate interpolation values among discrete data, by using a fundamental term calculation unit configured to perform a convolution operation using a fundamental sampling function applied to said discrete data, a control term calculation unit configured to perform a convolution operation using a control sampling function applied to said discrete data and a linear adding unit configured to linearly add the calculated results obtained by each of said convolution operations, wherein a sampling function used in said function processing unit consists of said fundamental sampling function which is finitely differentiable and has a value of finite support and of a said control sampling function which is finitely differentiable and has a value of finite support and further exhibits a waveform different from a waveform exhibited by the fundamental sampling function, wherein said function processing unit includes a coefficient multiplication unit configured to multiply a value of the calculated result of said convolution operation using said control sampling function by a variable parameter settable as an arbitrary value by a user, and wherein when a sampling position of said discrete data is defined as t and said fundamental sampling function is defined as f(t), said fundamental sampling function is expressed by the following formula 20, $$f(t) = \begin{cases} 0 & t \in (-\infty, -1) \\ 2(t+1)^2 & t \in \left[-1, -\frac{1}{2}\right) \\ -2t^2 + 1 & t \in \left[-\frac{1}{2}, \frac{1}{2}\right) \\ 2(-t+1)^2 & t \in \left[\frac{1}{2}, 1\right) \\ 0 & t \in [1, \infty), \end{cases} \quad \text{[Formula 20]}$$

when said control sampling function is set as C0(t)=Cr(t)+Cr(-t), said Cr(t) is expressed by the following formula 21, $$c_r(t) = \begin{cases} 0 & t \in (-\infty, 0) \\ -t^2 & t \in \left[0, \frac{1}{2}\right) \\ 3(-t+1)^2 - 2(-t+1) & t \in \left[\frac{1}{2}, 1\right) \\ -3(t-1)^2 + 2(t-1) & t \in \left[1, \frac{3}{2}\right) \\ (-t+2)^2 & t \in \left[\frac{3}{2}, 2\right) \\ 0 & t \in [2, \infty) \end{cases} \quad \text{[Formula 21]}$$

and the sampling function is expressed by the following formula 22, $$s_2(t) = f(t) + \alpha \cdot c_0(t) \quad \text{[Formula 22]}$$

wherein said variable parameter settable as an arbitrary value by a user is defined as a and the sampling function between sampling position [-2, 2] of the discrete data is defined as $s_2(t)$.

2. The sound processing apparatus according to claim 1, wherein said function processing unit is configured to calculate said interpolation values by performing the convolution operation to each of said discrete data, using said fundamental sampling function in said fundamental term calculation unit and said control sampling function in said control term calculation unit, and by using said linear adding unit to linearly add calculated results obtained by said convolution operation using said sampling function.

3. The sound processing apparatus according to claim 1, wherein said discrete data extraction unit is configured to extract a given number of said discrete data existing in such a manner as to sandwich a marked point where said interpolation values are calculated,
said fundamental term calculation unit is configured to calculate a value of said fundamental sampling function, using a distance to said marked point determined for each of said discrete data extracted by said discrete data extraction unit and then calculating a fundamental interpolation value at said marked point, by performing the convolution operation to a value of said fundamental sampling function allowed to correspond to each of said discrete data,
said control term calculation unit is configured to calculate a value of said control sampling function, using a distance to said marked point determined for each of said discrete data extracted by said discrete data extraction unit and then calculating a control interpolation value at said marked point by performing the convolution operation to a value of said control sampling function allowed to correspond to each of said discrete data, and
a linear adding unit is configured to calculate said interpolation values by linearly adding said fundamental interpolation value calculated by said fundamental term calculation unit and said control interpolation value calculated by said control term calculation unit.

4. The sound processing apparatus according to claim 1, wherein said discrete data extraction unit is configured to extract a given number of said discrete data existing in such a manner as to sandwich a marked point where said interpolation values are calculated, and
said function processing unit is configured to be equipped with
a function calculation means in which said sampling function produced by linearly adding said fundamental sampling function and said control sampling function in advance is stored and which calculates a value of said sampling function, using a distance to said marked point determined for each of said discrete data; and
the convolution operation means for calculating an interpolation value at said marked point by performing the convolution operation to a value of said sampling function allowed to correspond to each of said discrete data.

5. The sound processing apparatus according to claim 1, wherein said fundamental sampling function is a function which can be expressed by a piecewise polynomial once differentiable at an interval [-1, 1] of a sampling position of said discrete data and is expressed invariably as 0 in the other interval, while said control sampling function is a function which can be expressed by a piecewise polynomial once differentiable at an interval [-2, 2] of a sampling position of said discrete data and is expressed invariably as 0 in the other intervals.

6. The sound processing apparatus according to claim 1, wherein a selector is provided in which a plurality of said variable parameters different in value is stored in advance and any one of said variable parameters to be multiplied by said control sampling function is selected from a plurality of said variable parameters.

7. The sound processing apparatus according to claim 1, wherein said function processing unit is configured to be programmed in a programmable signal processing device for forming a calculating configuration with a controlling formation desired by a user, based on program data specified by a user.

8. The sound processing apparatus according to claim 1, wherein after tabulating each of values of said fundamental sampling function and said control sampling function which are calculated in advance according to a given number of sectioned portions among said discrete data marked, said fundamental sampling function and said control sampling function perform the convolution operation between said tabulated values of said control sampling function and said discrete data, the multiplication of an output of said convolution operation by said variable parameters and said linear adding of the results of said multiplication, said tabulated values of said control sampling function and said convolution operation every time said discrete data are input, thus outputting said interpolation values.

9. The sound processing apparatus according to claim 8, wherein when the number of said sectioned portions among said discrete data is plural, said tabulated values are calculated in advance using the lowest common multiple in the number of said sectioned portions and thereafter according to the number of said sectioned portions set at the start of inputting said discrete data, said tabulated values are selected and extracted at intervals of said lowest common multiple or sectioned portions to perform convolution operations between said tabulated values and said discrete data.

10. The sound processing apparatus according to claim 1 further comprising:
a band separation unit configured to separate a plurality of temporally-ordered discrete data into a plurality of frequency bands to produce band-by-band signals in a time domain;
an interpolation processing unit configured to produce interpolation processing signals whose sampling frequency of said band-by-band signals in a time domain is increased for each of said frequency bands, by performing individually an interpolating process for producing signals among said discrete data for each of said band-by-band signals in a time domain; and
a band synthesizing unit configured to produce synthesized signals in a time domain by synthesizing a plurality of said interpolation processing signals produced for each of said frequency bands.

11. The sound processing apparatus according to claim 10 further comprising a sound pressure regulating unit configured to multiply any one of said band-by-band signal and said interpolation processing signal by a sound pressure parameter to produce a regulated band-by-band signal whose sound pressure level is regulated for each of said frequency bands,
wherein when multiplying said band-by-band signal by said sound pressure parameter, said interpolation processing unit performs said interpolation process individually for each of said regulated band-by-band signals.

12. The sound processing apparatus according to claim 11, wherein said sound pressure parameter different in each of said band-by-band signals is settable.

13. A sound processing method for interpolating in an audio processing circuit positions among a plurality of temporally-ordered discrete data input in series at given time intervals, the sound processing method including
an input step in which an input unit sequentially outputs a plurality of said temporally-ordered discrete data to a sound processing unit,
a parameter setting step in which a variable parameter is set as an arbitrary value by a user for use in a function processing unit of said audio processing circuit,
a function processing step performed by said function processing unit having a circuit configuration configured to calculate interpolation values among discrete data comprising audio information, by performing each of convolution operations, using a fundamental sampling function and a control sampling function, applied to a plurality of temporally-ordered discrete data and by linearly adding the calculated results obtained by each of said convolution operations, using a sampling function consisting of a fundamental sampling function which is finitely differentiable and has a value of finite support and of a control sampling function which is multiplied by said variable parameter, is finitely differentiable and further has a value of finite support and exhibits a waveform different from a waveform exhibited by the sampling function, and
an output step in which said interpolation values among discrete data are output to an output unit,
wherein when a sampling position of said discrete data is defined as t and said fundamental sampling function is defined as f(t), said fundamental sampling function is expressed by the following formula 23, $$c_r(t) = \begin{cases} 0 & t \in (-\infty, 0) \\ -t^2 & t \in \left[0, \frac{1}{2}\right) \\ 3(-t+1)^2 - 2(-t+1) & t \in \left[\frac{1}{2}, 1\right) \\ -3(t-1)^2 + 2(t-1) & t \in \left[1, \frac{3}{2}\right) \\ (-t+2)^2 & t \in \left[\frac{3}{2}, 2\right) \\ 0 & t \in [2, \infty) \end{cases}$$ [Formula 23]

when said control sampling function is set as C0(t)=Cr(t)+ Cr (−t), said Cr(t) is expressed by the following formula 24, $$c_r(t) = \begin{cases} 0 & t \in (-\infty, 0) \\ -t^2 & t \in \left[0, \frac{1}{2}\right) \\ 3(-t+1)^2 - 2(-t+1) & t \in \left[\frac{1}{2}, 1\right) \\ -3(t-1)^2 + 2(t-1) & t \in \left[1, \frac{3}{2}\right) \\ (-t+2)^2 & t \in \left[\frac{3}{2}, 2\right) \\ 0 & t \in [2, \infty) \end{cases}$$ [Formula 24]

and the sampling function is expressed by the following formula 25, $$s_2(t) = f(t) + + \cdot c_0(t)$$ [Formula 25]

wherein said variable parameter settable as an arbitrary value by a user is defined as a and the sampling function between sampling position [−2, 2] of the discrete data is defined as $s_2(t)$.

14. The sound processing method according to claim 13, wherein the function processing step includes:
a convolution operation step performed by a fundamental term calculation unit and control term calculation unit which have a circuit configuration configured to perform the convolution operation to each of said discrete data, using said fundamental sampling function and said control sampling function; and
a linear adding step performed by a linear adding unit having a circuit configuration configured to calculate said interpolation values by linearly adding calculated results obtained by said convolution operation using said fundamental sampling function and said control sampling function.

15. The sound processing method according to claim 13 further including a discrete data extraction step performed by a discrete data extraction unit having a circuit configuration configured to extract a given number of said discrete data existing in such a manner as to sandwich a marked point where said interpolation values are calculated,
wherein said function processing step includes:
a fundamental term calculation step performed by a fundamental term calculation unit having a circuit configuration configured to calculate a value of said fundamental sampling function, using a distance to said marked point determined for each of said discrete data extracted at said discrete data extracting step and then calculating a value of a basic interpolation value at said marked point by performing the convolution operation to a value of said fundamental sampling function allowed to correspond to each of said discrete data;

a control term calculation step performed by a control term calculation unit having a circuit configuration configured to calculate a value of said control sampling function, using a distance to said marked point determined for each of said discrete data extracted at said discrete data extraction step and then calculating a control interpolation value at said marked point by performing the convolution operation to a value of said control sampling function allowed to correspond to each of said discrete data; and a linear adding step performed by a linear adding unit having a circuit configuration configured to calculate said interpolation value by linearly adding said fundamental interpolation value calculated at said fundamental term calculation step and said control interpolation value calculated at said control term calculation step.

16. The sound processing method according to claim 13 further including a discrete data extraction step performed by a discrete data extraction unit having a circuit configuration configured to extract a given number of said discrete data existing in such a manner as to sandwich a marked point where said interpolation values are calculated, wherein said function processing step includes:

a function calculation step for storing in advance said sampling function produced by linearly adding said fundamental sampling function and said control sampling function and thereafter calculating a value of said sampling function, using a distance to said marked point determined for each of said discrete data; and the convolution operation step for calculating an interpolation value at said marked point by performing the convolution operation to a value of said sampling function allowed to correspond to each of said discrete data.

17. The sound processing method according to claim 13, wherein said fundamental sampling function is a function which is expressed by a piecewise polynomial once differentiable at an interval [−1, 1] of a sampling position of said discrete data and is expressed invariably as 0 at the other intervals, while said control sampling function is a function which can be expressed by a piecewise polynomial once differentiable at an interval [−2, 2] of a sampling position of said discrete data and is expressed invariably as 0 at the other intervals.

18. The sound processing method according to claim 13, wherein in said parameter setting step, any one of a plurality of said variable parameters to be multiplied by said control sampling function is selected from a plurality of said variable parameters which are stored in advance and are different in said numerical value.

19. The sound processing method according to claim 13, wherein said function processing step is performed by a calculation circuit configuration with a controlling formation which is desired by a user and is programmed in a programmable signal processing device based on program data specified by a user.

20. The sound processing method according to claim 13, wherein in said function processing step, after tabulating each of calculated values of said fundamental sampling function and said control sampling function, in advance according to a given number of sectioned portions among said discrete data marked, there are performed the convolution operation, which is performed by a control term matrix calculation circuit, between said tabulated values of said control sampling function and said discrete data, multiplications, which are performed by a coefficient multiplication unit, of an output value of said convolution operation by said variable parameters and said linear adding, which is performed by a linear adding unit, of the results of said multiplication and said convolution operation, which is performed by a fundamental term matrix calculation circuit, between said tabulated values of said fundamental sampling function and said discrete data every time said discrete data are input, thus outputting said interpolation values.

21. The sound processing method according to claim 20, wherein in said function processing step, when the number of said sectioned portions among said discrete data is plural, said tabulated values are calculated in advance using the lowest common multiple in the number of said sectioned portions, and thereafter according to the number of said sectioned portions set at the start of inputting said discrete data, said tabulated values are selected and extracted at each interval of said lowest common multiple or sectioned portions to perform convolution operations between said tabulated values and said discrete data.

22. The sound processing method according to claim 13 further including:

a band separation step performed by a band separation unit having a circuit configuration configured to separate a plurality of temporally-ordered discrete data into a plurality of frequency bands to produce band-by-band signals in a time domain;

an interpolation processing step performed by an interpolation processing unit having a circuit configuration configured to produce interpolation processing signals whose sampling frequency of said band-by-band signals in a time domain is increased for each of said frequency bands, by performing individually an interpolating process for producing signals among said discrete data for each of said band-by-band signals in a time domain; and a band synthesizing step performed by a band synthesizing unit having a circuit configuration configured to produce synthesized signals in a time domain by synthesizing a plurality of interpolation processing signals produced for each of said frequency bands.

23. The sound processing method according to claim 13 further including a sound pressure regulating step provided behind any one of said band separation step and interpolating processing step, wherein said sound pressure regulating step is performed by a sound pressure regulating unit having a circuit configuration configured to multiply said band-by-band signal by a sound pressure parameter behind said band separation step and to multiply said interpolation processing signal by a sound pressure parameter behind said interpolation processing step to produce regulated band-by-band signals behind said interpolation processing step, while said interpolation processing unit is configured to perform said interpolation process independently for each of said regulated band-by-band signals when multiplying said band-by-band signal by said sound pressure parameter.

24. The sound processing method according to claim 23 further including a sound pressure parameter setting step, wherein said sound pressure parameter different in each of said band-by-band signals is settable by a setting unit.

* * * * *